US012732174B1

(12) United States Patent
Yanamandra et al.

(10) Patent No.: US 12,732,174 B1
(45) Date of Patent: Sep. 8, 2026

(54) HYBRID PHASE INTERPOLATOR WITH UNIFIED BLENDER AND EYE-SURF CIRCUIT

(71) Applicant: Cadence Design Systems, Inc., San Jose, CA (US)

(72) Inventors: Satya Someswara Kaushik Yanamandra, Gaithersburg, MD (US); Benjamin L. Heilmann, Southport, NC (US); Mark A. Summers, Cary, NC (US)

(73) Assignee: Cadence Design Systems, Inc., San Jose, CA (US)

( * ) Notice: Subject to any disclaimer, the term of this patent is extended or adjusted under 35 U.S.C. 154(b) by 90 days.

(21) Appl. No.: 18/963,251

(22) Filed: Nov. 27, 2024

(51) Int. Cl.
*H03K 5/135* (2006.01)
*H03K 5/00* (2006.01)

(52) U.S. Cl.
CPC ... *H03K 5/135* (2013.01); *H03K 2005/00052* (2013.01)

(58) Field of Classification Search
CPC ...................................................... H03K 5/135
See application file for complete search history.

(56) References Cited

U.S. PATENT DOCUMENTS 10,333,533 B1 * 6/2019 Moscone ............... H03H 11/00
10,686,582 B1 * 6/2020 Pasdast ..................... H03L 1/00
11,016,920 B2 * 5/2021 Bandi ..................... G06F 15/76
11,139,949 B2 * 10/2021 Nodenot ............... H04L 7/0025
2005/0147194 A1 * 7/2005 Koenenkamp .......... H03L 7/091 375/348
2013/0266103 A1 * 10/2013 Bae ........................... H04L 7/00 375/354
2017/0032214 A1 * 2/2017 Krenzer .................... G06T 3/40
2017/0093558 A1 * 3/2017 Ramezani ............. H04L 7/0029
2019/0089520 A1 * 3/2019 Dvir ......................... H04B 1/00
2020/0099506 A1 * 3/2020 Goudarzi .............. H04L 7/0025
2021/0091921 A1 * 3/2021 Nodenot ............... H04L 7/0025
2023/0208411 A1 * 6/2023 Foley .................... H03M 1/661 327/276

* cited by examiner

*Primary Examiner* — Menatoallah Youssef
*Assistant Examiner* — Khareem E Almo
(74) *Attorney, Agent, or Firm* — Schwegman Lundberg & Woessner, P.A.

(57) ABSTRACT

A unified blender/eye-surf circuit has a first signal path operable in a blender mode to blend phases of two phase-shifted clock signals of a first plurality of phase-shifted clock signals in a fixed ratio to generate a first blended clock signal, and operable in an eye-surf test mode to create variable phase offsets as weighted combinations of pairs phase-shifted clock signals of the first plurality of phase-shifted clock signals to generate the first blended clock signal. A second signal path is operable in the blender mode to blend phases of two phase-shifted clock signals of a second plurality of phase-shifted clock signals in a fixed ratio to generate a second blended clock signal, and operable in an eye-surf test mode to create variable phase offsets as weighted combinations of pairs phase-shifted clock signals of the second plurality of phase-shifted clock signals to generate the second blended clock signal.

20 Claims, 14 Drawing Sheets

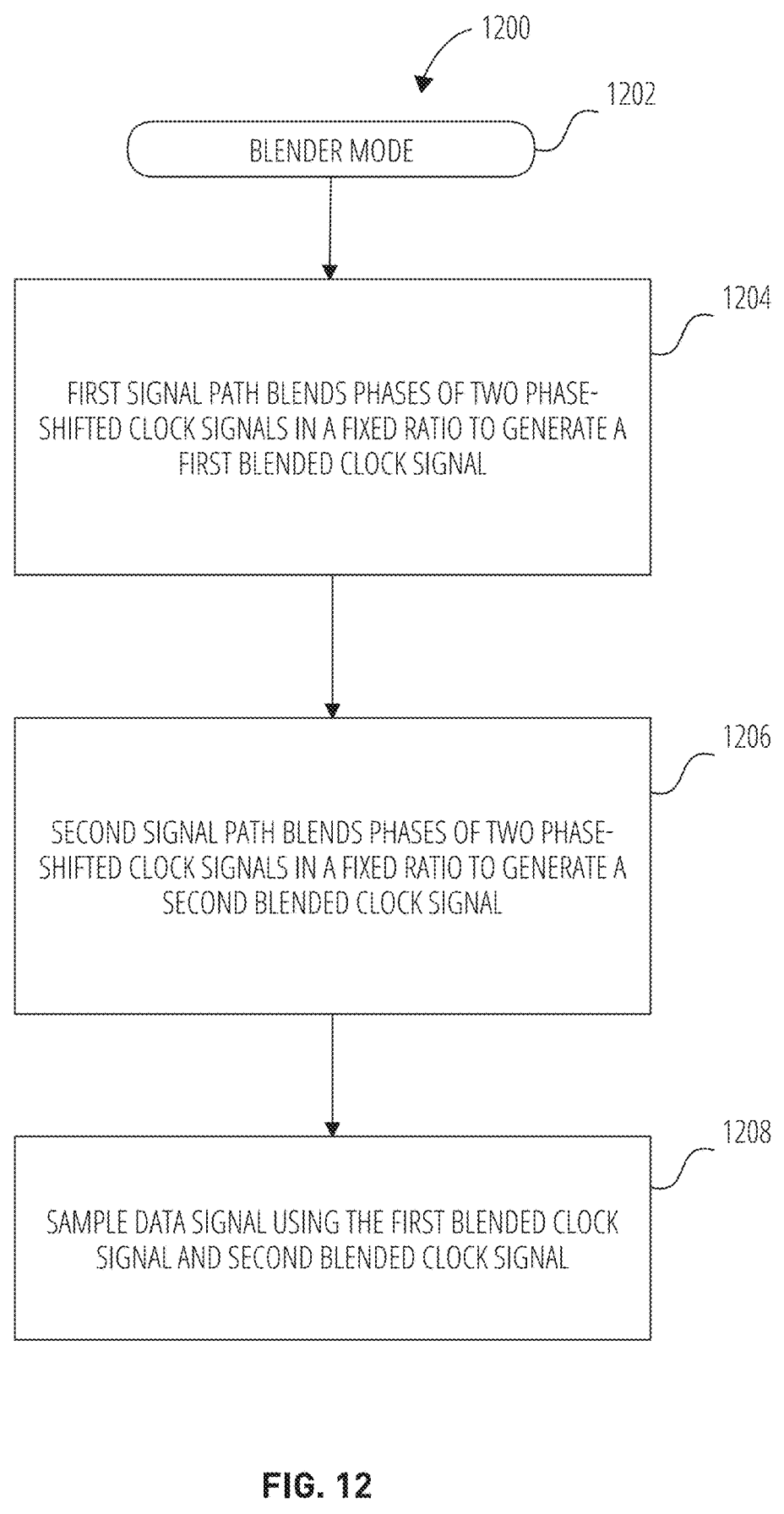

1200

1202 BLENDER MODE

1204 FIRST SIGNAL PATH BLENDS PHASES OF TWO PHASE-SHIFTED CLOCK SIGNALS IN A FIXED RATIO TO GENERATE A FIRST BLENDED CLOCK SIGNAL

1206 SECOND SIGNAL PATH BLENDS PHASES OF TWO PHASE-SHIFTED CLOCK SIGNALS IN A FIXED RATIO TO GENERATE A SECOND BLENDED CLOCK SIGNAL

1208 SAMPLE DATA SIGNAL USING THE FIRST BLENDED CLOCK SIGNAL AND SECOND BLENDED CLOCK SIGNAL

FIG. 12

HYBRID PHASE INTERPOLATOR WITH UNIFIED BLENDER AND EYE-SURF CIRCUIT

TECHNICAL FIELD

The present disclosures relate to high-speed serial interface circuits and, in some examples, to phase interpolation and eye-surf testing in clock and data recovery circuits for serializer/deserializer receivers.

BACKGROUND

High-speed serial interfaces enable data communication between integrated circuits at multi-gigabit rates. These interfaces employ clock and data recovery circuits in receivers to properly sample incoming data streams by aligning clock phases. Phase interpolation techniques allow precise clock phase adjustment through digital control, with implementations including current mode logic (CML), voltage mode, and charge-based approaches. Modern serializer/deserializer (SerDes) receivers utilize analog-to-digital converters (ADCs) to sample data at high rates, supporting protocols like PCI Express that operate across multiple data rates. The clock distribution network in these receivers must maintain precise timing relationships while minimizing power consumption and silicon area.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

FIG. 12 is a flow diagram illustrating operations for sampling a data signal using unified blender and eye-surf functionality, according to some examples.

DETAILED DESCRIPTION

Figure 1:
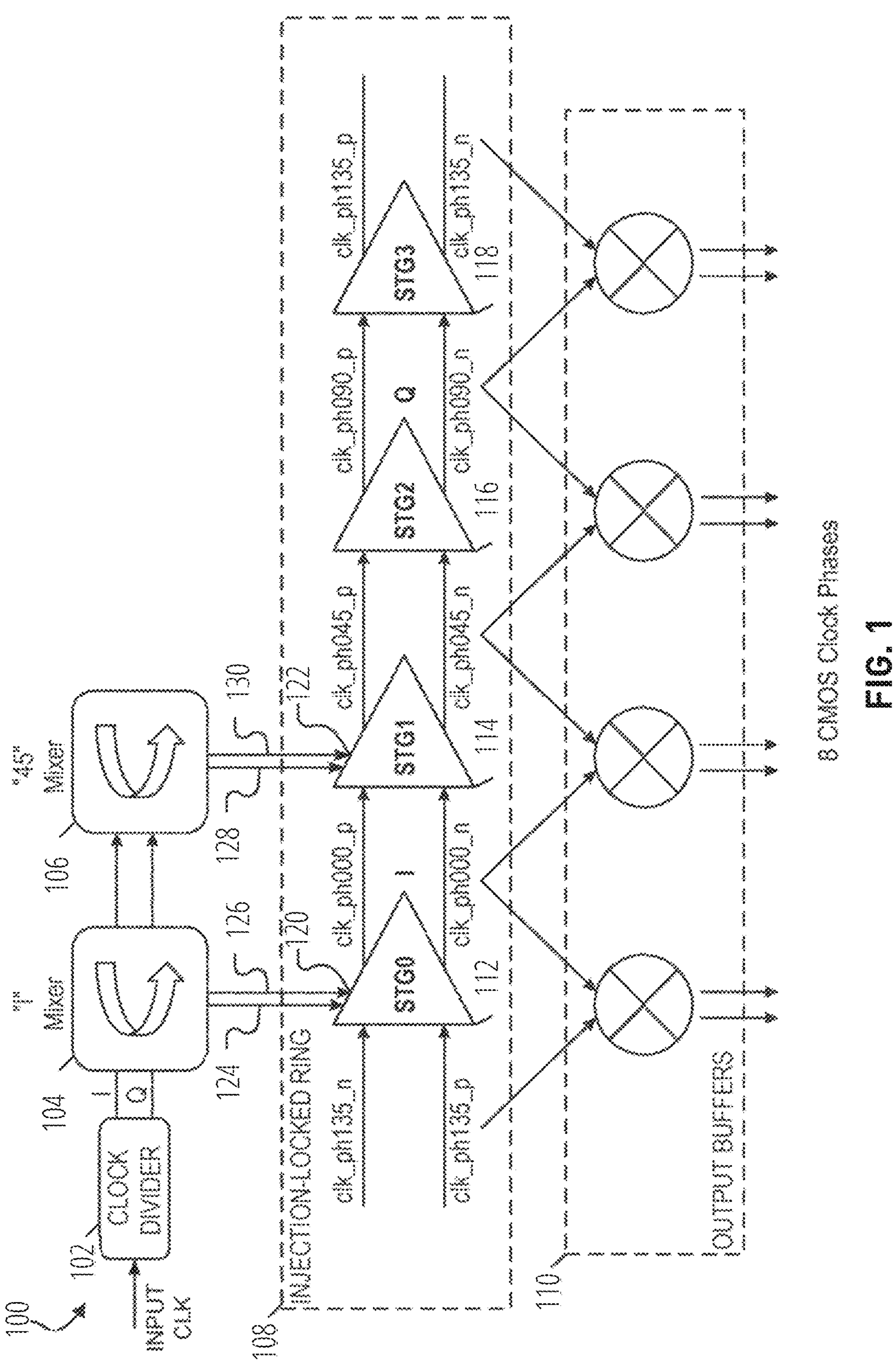
FIG. 1 is a circuit diagram illustrating a hybrid phase interpolator, according to some examples.

Reference will now be made in detail to specific example embodiments for carrying out the inventive subject matter. Examples of these specific embodiments are illustrated in the accompanying drawings, and specific details are set forth in the following description in order to provide a thorough understanding of the subject matter. It will be understood that these examples are not intended to limit the scope of the claims to the illustrated embodiments. On the contrary, they are intended to cover such alternatives, modifications, and equivalents as may be included within the scope of the disclosure.

High-speed serial interfaces require precise clock and data recovery mechanisms to properly sample incoming data streams. Examples described herein provide phase interpolator (PI) technology having a unified clock phase blender and eye-surf circuit, potentially reducing PI footprint, improving clock skew, and/or addressing other technical challenges in modern serializer/deserializer (SerDes) receivers.

An eye-surf circuit is a testing path that verifies operating margins by scanning across the data eye diagram to determine how much margin is available once the receiver is in a locked state. Eye-surf refers to the process of moving clock phases around a locked sampling point to detect where errors occur, which indicates the boundaries of reliable operation in the data eye.

Phase interpolators enable digital control of clock phases for data sampling in receivers. Conventional PI implementations use separate paths for normal operation and eye-surf testing. In ADC-based receivers, this separate path approach requires additional analog-to-digital converters and mixer circuits, resulting in significant silicon area overhead.

The described PI architecture combines phase blending and eye-surf functionality into a single unified circuit structure, which may be referred to herein as a unified circuit. During normal operation, the unified circuit functions as a blender, combining phase-shifted clock signals with equal weighting. In test mode, the same physical circuit elements create controlled phase offsets through opposite directional movement between I and Q paths In-phase (I) and Quadrature (Q) clocks, which are generally phase-separated by 90 degrees; four such phase-separated clocks can be used as sampling clocks to lock to the input data.

The unified circuit employs differential pairs receiving phase-shifted clock inputs separated by 45 degrees. Current sources and tuning resistors enable precise control of signal combining and phase relationships. The Q-path controls operate in an inverse relationship with the I-path controls during test mode, allowing creation of positive or negative IQ skew for margin testing.

Examples described herein can be implemented using a hybrid PI having an injection-locked ring, which generates multiple clock phases while maintaining proper phase relationships. The ring comprises delay stages that contribute finite delays, creating phase-shifted versions of the oscillator signal. This approach enables equal loading of clock phases during both normal and test modes. An example of a hybrid PI having an injection-locked ring and a phase blender is described in U.S. Pat. No. 10,333,533 to Moscone, filed Sep. 18, 1124 and issued Jun. 25, 2019 (hereinafter the "Moscone reference"), which is hereby incorporated by reference in its entirety, and examples of which are described below with reference to FIG. 1 through FIG. 6. The unified blender and eye-surf circuit described herein can be utilized to modify the structure and functionality of the hybrid PI described in the Moscone reference.

In some examples, the I-path of the unified circuit can apply phase shifts over a 135 degree span from −45 to 90 degrees. The Q-path of the unified circuit can apply phase shifts over a 135 degree span from 45 to 180 degrees. Applying each of the phases also includes generating a complementary phase shifted 180 degrees, thereby providing a differential pair of 180-degree phase-shifted clock signals. I and Q are skewed in opposite directions to obtain a 270-degree phase skew overall for eye-surf operation. Thus, the unified blender and eye-surf circuit can provide a 270-degree phase range using eye-surf codes 0-47, which is sufficient for margin testing applications. In an example eye-surf encoding scheme described herein, at the mid-phase eye-surf code value 24, the I (22.5°) and Q (112.5°) outputs maintain a 90-degree phase relationship. Similarly, at eye-surf code value 40, the I (67.5°) and Q (67.5°) outputs are aligned in phase. The unified blender and eye-surf circuit can thereby achieve a resolution of 3.9 picoseconds (ps) for a 4 GHz clock in PCIe GEN3 applications.

This example eye-surf encoding scheme is set out below, and can be regarded as one example implementation of an eye-surf encoding to control the unified blender and eye-surf circuit described herein:

| Code-I | −45 <15:0> | 0 <31:16> | 45 <47:32> | 90 <63:48> | Code-Q | 45 <63:48> | 90 <47:32> | 135 <31:16> | 180 <15:0> |
|---|---|---|---|---|---|---|---|---|---|
| 0 | 16 | 0 | 0 | 0 | 0 | 0 | 0 | 0 | 16 |
| 1 | 15 | 1 | 0 | 0 | 1 | 0 | 0 | 1 | 15 |
| 2 | 14 | 2 | 0 | 0 | 2 | 0 | 0 | 2 | 14 |
| 3 | 13 | 3 | 0 | 0 | 3 | 0 | 0 | 3 | 13 |
| 4 | 12 | 4 | 0 | 0 | 4 | 0 | 0 | 4 | 12 |
| 5 | 11 | 5 | 0 | 0 | 5 | 0 | 0 | 5 | 11 |
| 6 | 10 | 6 | 0 | 0 | 6 | 0 | 0 | 6 | 10 |
| 7 | 9 | 7 | 0 | 0 | 7 | 0 | 0 | 7 | 9 |
| 8 | 8 | 8 | 0 | 0 | 8 | 0 | 0 | 8 | 8 |
| 9 | 7 | 9 | 0 | 0 | 9 | 0 | 0 | 9 | 7 |
| 10 | 6 | 10 | 0 | 0 | 10 | 0 | 0 | 10 | 6 |
| 11 | 5 | 11 | 0 | 0 | 11 | 0 | 0 | 11 | 5 |
| 12 | 4 | 12 | 0 | 0 | 12 | 0 | 0 | 12 | 4 |
| 13 | 3 | 13 | 0 | 0 | 13 | 0 | 0 | 13 | 3 |
| 14 | 2 | 14 | 0 | 0 | 14 | 0 | 0 | 14 | 2 |
| 15 | 1 | 15 | 0 | 0 | 15 | 0 | 0 | 15 | 1 |
| 16 | 0 | 16 | 0 | 0 | 16 | 0 | 0 | 16 | 0 |
| 17 | 0 | 15 | 1 | 0 | 17 | 0 | 1 | 15 | 0 |
| 18 | 0 | 14 | 2 | 0 | 18 | 0 | 2 | 14 | 0 |
| 19 | 0 | 13 | 3 | 0 | 19 | 0 | 3 | 13 | 0 |
| 20 | 0 | 12 | 4 | 0 | 20 | 0 | 4 | 12 | 0 |
| 21 | 0 | 11 | 5 | 0 | 21 | 0 | 5 | 11 | 0 |
| 22 | 0 | 10 | 6 | 0 | 22 | 0 | 6 | 10 | 0 |
| 23 | 0 | 9 | 7 | 0 | 23 | 0 | 7 | 9 | 0 |
| 24 | 0 | 8 | 8 | 0 | 24 | 0 | 8 | 8 | 0 |
| 25 | 0 | 7 | 9 | 0 | 25 | 0 | 9 | 7 | 0 |
| 26 | 0 | 6 | 10 | 0 | 26 | 0 | 10 | 6 | 0 |
| 27 | 0 | 5 | 11 | 0 | 27 | 0 | 11 | 5 | 0 |
| 28 | 0 | 4 | 12 | 0 | 28 | 0 | 12 | 4 | 0 |
| 29 | 0 | 3 | 13 | 0 | 29 | 0 | 13 | 3 | 0 |
| 30 | 0 | 2 | 14 | 0 | 30 | 0 | 14 | 2 | 0 |
| 31 | 0 | 1 | 15 | 0 | 31 | 0 | 15 | 1 | 0 |
| 32 | 0 | 0 | 16 | 0 | 32 | 0 | 16 | 0 | 0 |
| 33 | 0 | 0 | 15 | 1 | 33 | 1 | 15 | 0 | 0 |
| 34 | 0 | 0 | 14 | 2 | 34 | 2 | 14 | 0 | 0 |
| 35 | 0 | 0 | 13 | 3 | 35 | 3 | 13 | 0 | 0 |
| 36 | 0 | 0 | 12 | 4 | 36 | 4 | 12 | 0 | 0 |
| 37 | 0 | 0 | 11 | 5 | 37 | 5 | 11 | 0 | 0 |
| 38 | 0 | 0 | 10 | 6 | 38 | 6 | 10 | 0 | 0 |
| 39 | 0 | 0 | 9 | 7 | 39 | 7 | 9 | 0 | 0 |
| 40 | 0 | 0 | 8 | 8 | 40 | 8 | 8 | 0 | 0 |
| 41 | 0 | 0 | 7 | 9 | 41 | 9 | 7 | 0 | 0 |
| 42 | 0 | 0 | 6 | 10 | 42 | 10 | 6 | 0 | 0 |
| 43 | 0 | 0 | 5 | 11 | 43 | 11 | 5 | 0 | 0 |
| 44 | 0 | 0 | 4 | 12 | 44 | 12 | 4 | 0 | 0 |

-continued

| Code-I | −45 <15:0> | 0 <31:16> | 45 <47:32> | 90 <63:48> | Code-Q | 45 <63:48> | 90 <47:32> | 135 <31:16> | 180 <15:0> |
|---|---|---|---|---|---|---|---|---|---|
| 45 | 0 | 0 | 3 | 13 | 45 | 13 | 3 | 0 | 0 |
| 46 | 0 | 0 | 2 | 14 | 46 | 14 | 2 | 0 | 0 |
| 47 | 0 | 0 | 1 | 15 | 47 | 15 | 1 | 0 | 0 |
| 48 | 0 | 0 | 0 | 16 | 48 | 16 | 0 | 0 | 0 |

In the encoding scheme set out above:

1. The Code-I values correspond to sets of four weights applied to blend four phase-shifted clock signals in the I-path: a −45° clock, a 0° clock, a 45° clock, and a 90° clock. Each weight uses a thermal encoding scheme in which, for example, "16" indicates all the 16 bits of the bus are high or enabled (e.g., each bit has binary value 1), and "0" indicates none of the 16 bits of the bus are high or enabled (e.g., each bit has binary value 0).
2. The Code-Q values correspond to sets of four weights applied to blend four phase-shifted clock signals in the Q-path: a 45° clock, a 90° clock, a 135° clock, and a 180° clock. These weights also use a thermal encoding scheme as described above.

It will be appreciated that, in examples using only eye-surf codes 0-47, eye-surf codes 48:63 in the table above are unused, resulting in a 270° range for eye-surf testing instead of the full 360° range provided by some existing approaches.

Details of the four phase-shifted clock signals and their blending by the unified circuit are described in greater detail below with reference to the I-path blender/eye-surf mixer shown in FIG. 10A and the Q-path blender/eye-surf mixer shown in FIG. 10B.

In some examples, the unified circuit described herein can provide particular advantages in edge-based CDR receivers typically used for lower-datarate modes of multi-rate interfaces. Higher datarate modes may implement a Mueller-Mueller CDR which provides a different mechanism for eye-scan unlike edge-based CDR. While the described examples can result in destructive eye-scan testing compared to separate path implementations, the area savings can provide benefits in these applications, e.g., by providing a lower datarate test mode debug feature.

In various examples, the unified circuit can be implemented using current mode logic (CML) to potentially improve linearity, or using a voltage mode approach for lower power consumption. The unified circuit can support both sampler-based and ADC-based receiver implementations, though some examples may provide particular benefits in ADC-based systems where area efficiency is paramount.

In some examples, the unified circuit maintains equal loading of clock phases for an injection-locked ring stage through the use of 45-degree phase shifted clocks rather than traditional 90-degree approaches. This prevents IQ skew issues arising from the injection-locked ring stage propagating down to the sampling clock signals. Another potential benefit of using 45-degree phase-shifted clocks is better linearity for blending equal phases during a normal operation mode and more linear phase skews during an eye-surf testing mode.

For specific applications like PCIE GEN-6 designs operating at 2.5 Gbps NRZ-64 Gbps PAM4, the unified circuit can support wide operating ranges while minimizing or reducing area overhead. The use of a unified circuit can be especially beneficial in receivers employing both Mueller-Mueller (MM) CDR for higher datarates and edge-based CDR for lower datarates where backward compatibility requirements necessitate eye-surf testing capability for all operating datarates.

Figure 7:
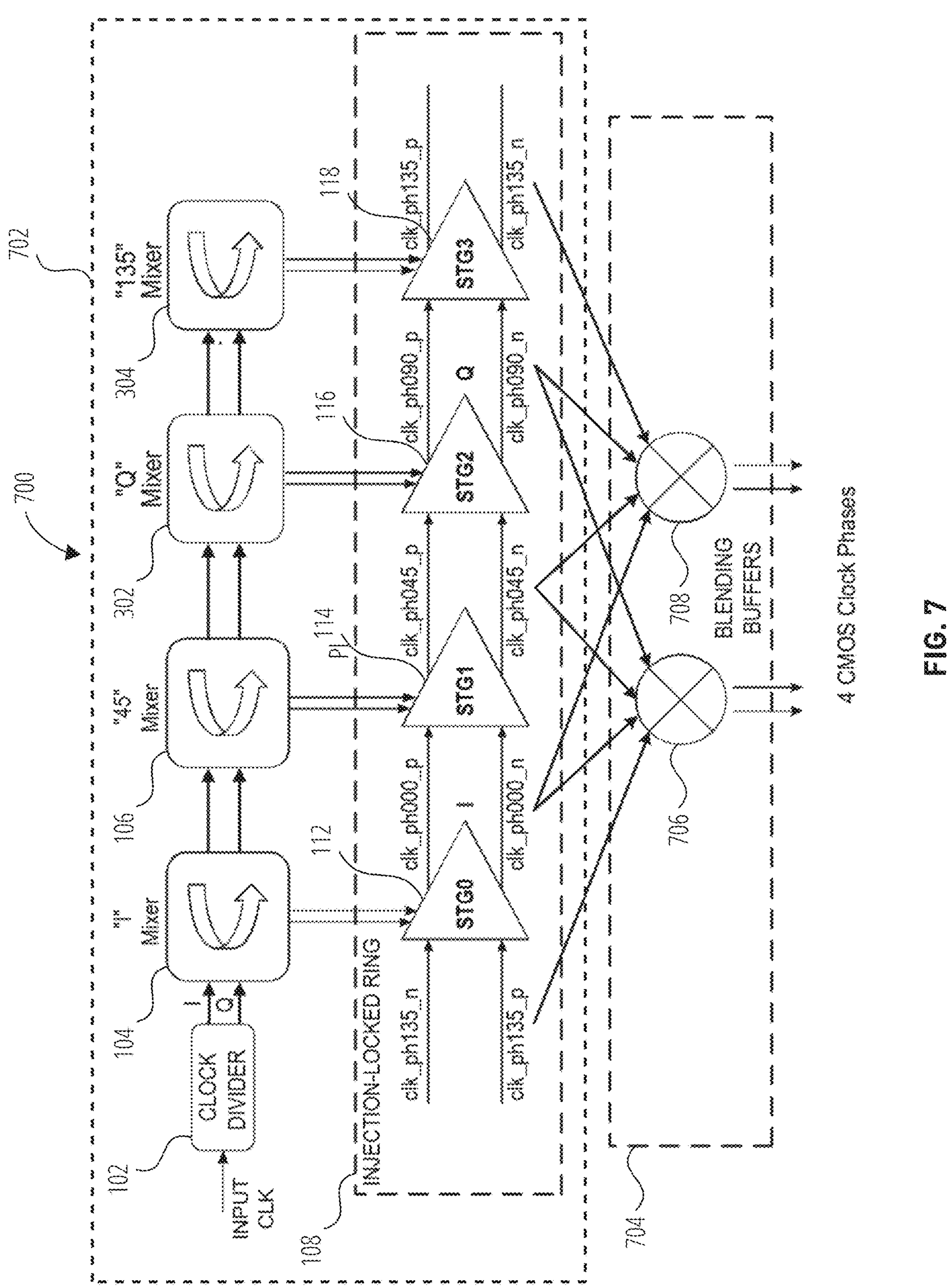
FIG. 7 is a block diagram illustrating a blending hybrid phase interpolator with blending buffers, according to some examples.
Figure 8:
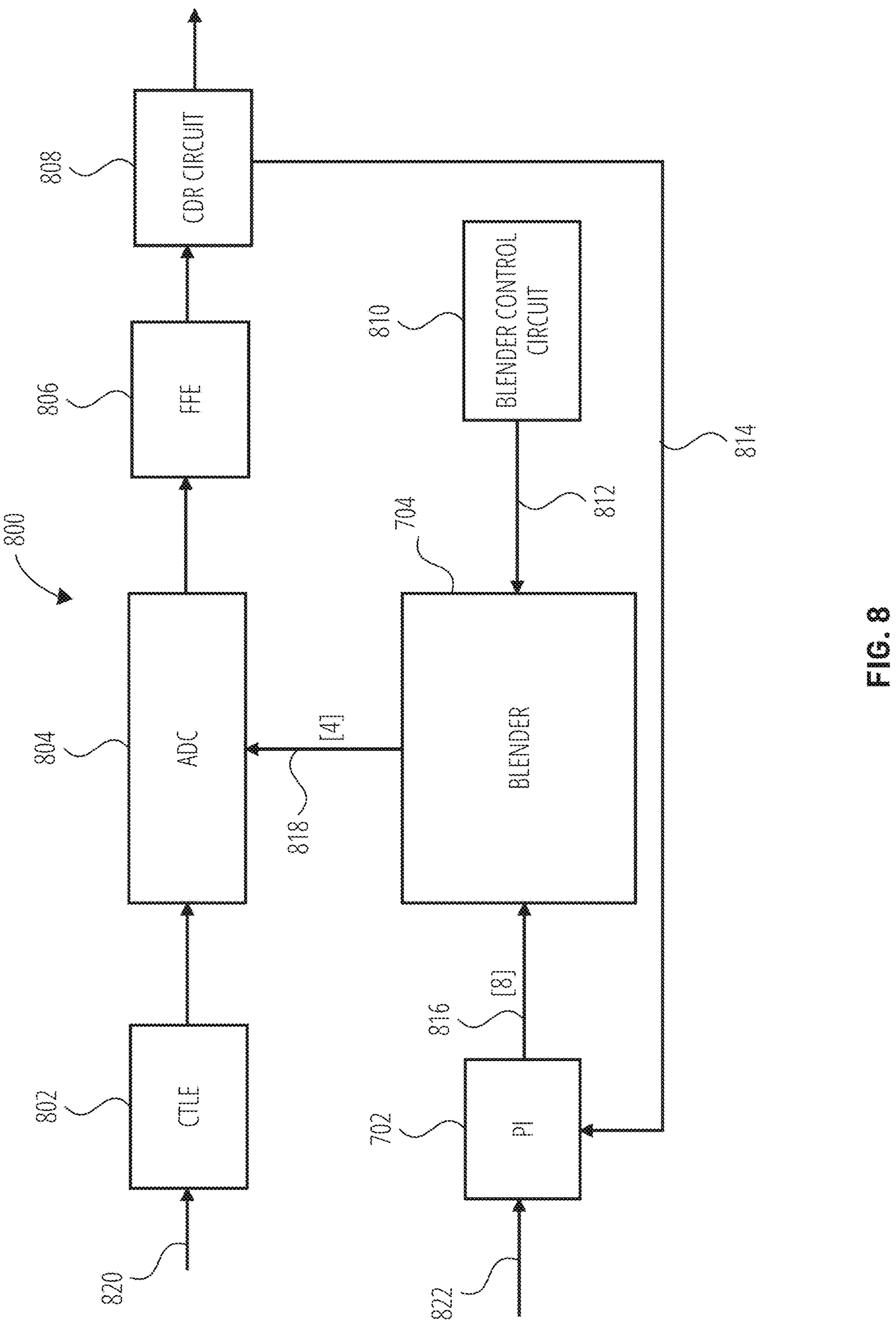
FIG. 8 is a block diagram illustrating a clock and data recovery system with phase interpolator and blender control, according to some examples.
Figures 9A, 9B:
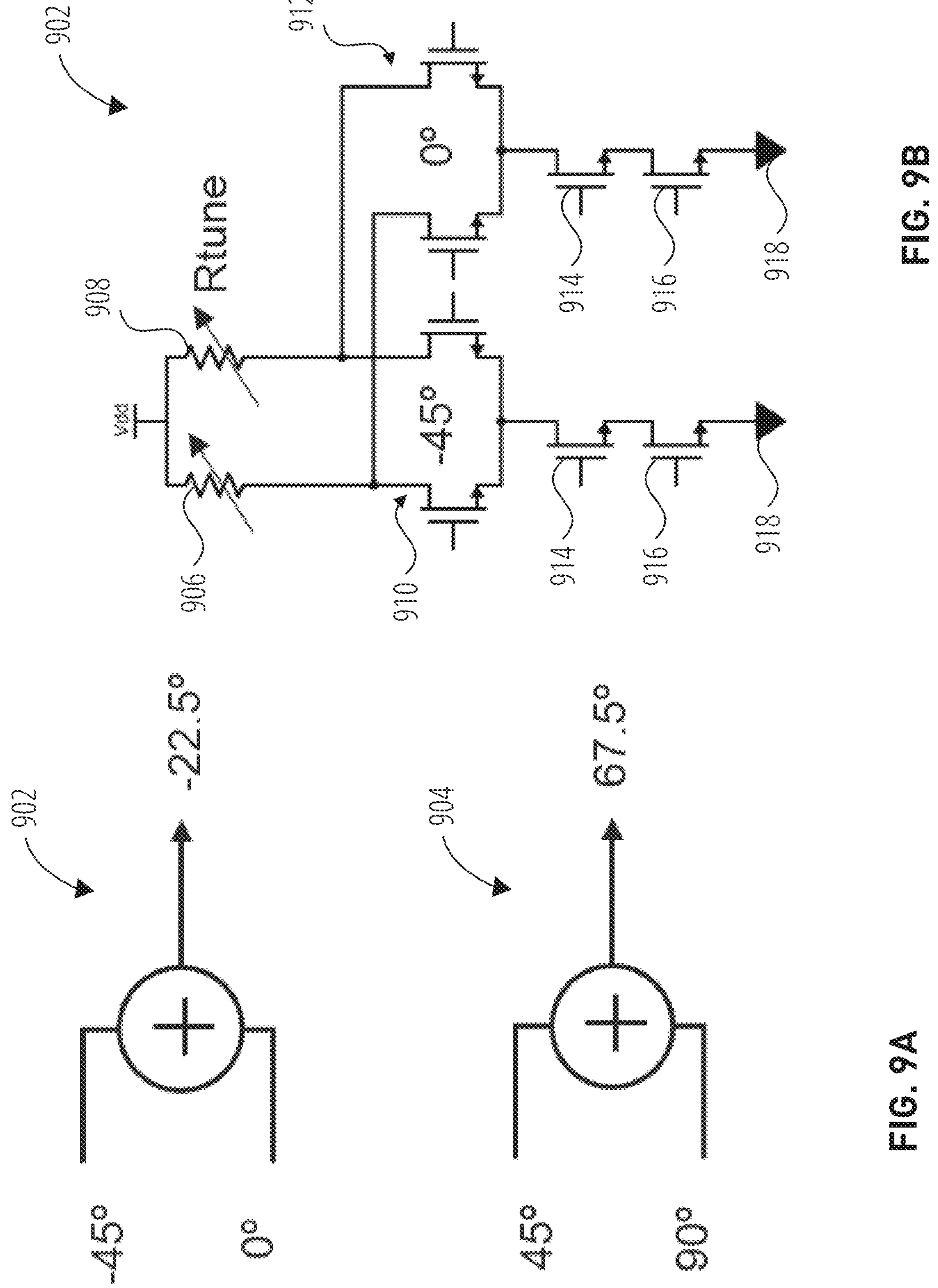
FIG. 9A is a schematic diagram illustrating the functioning of an I-path blender and a Q-path blender used in a blending hybrid phase interpolator, according to some examples.
FIG. 9B is a circuit diagram illustrating an implementation of the I-path blender of FIG. 9A with corresponding phase-shifted inputs, according to some examples.
Figure 14:
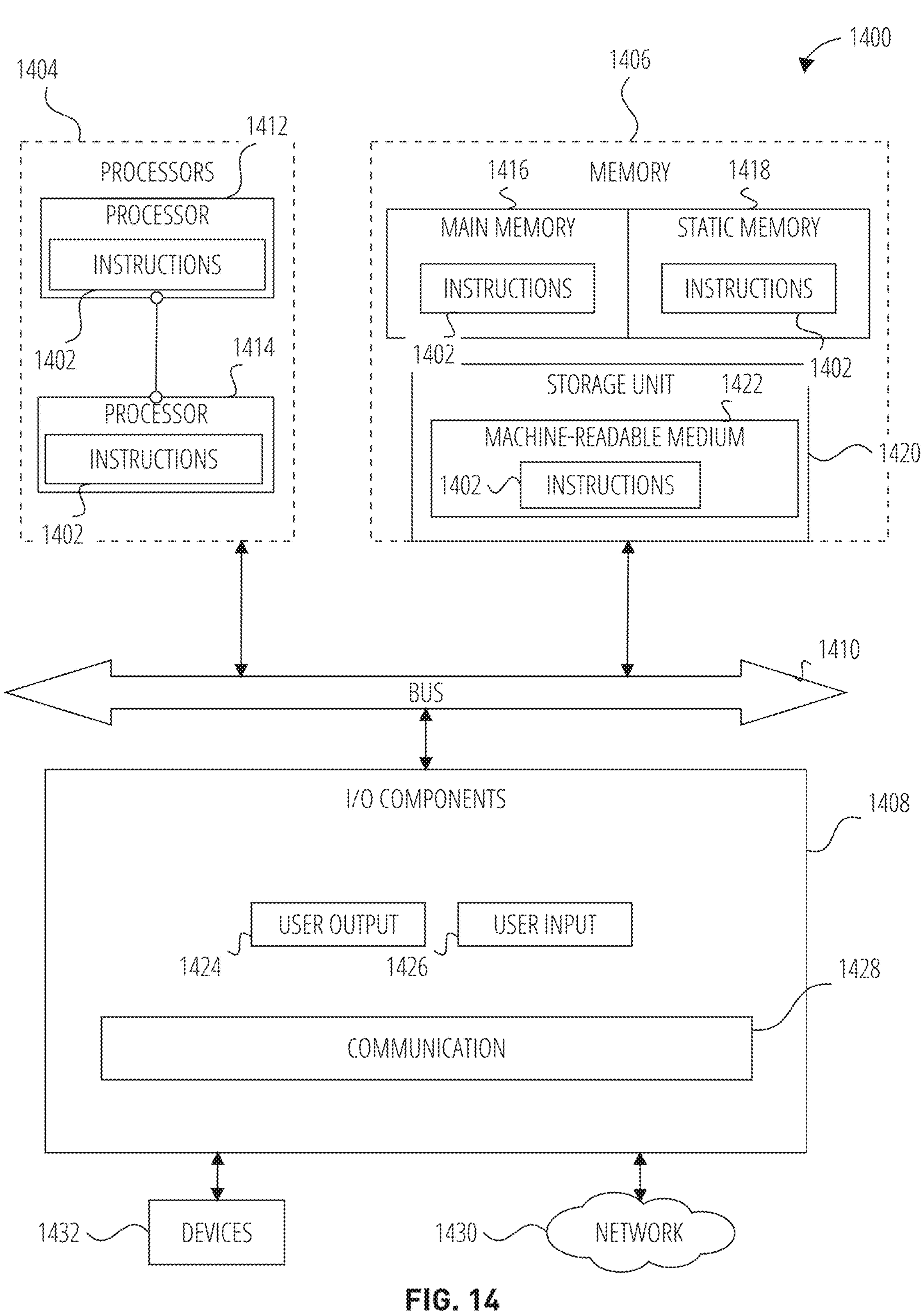
FIG. 14 is a diagrammatic representation of a machine in the form of a computer system within which a set of instructions may be executed to cause the machine to perform any one or more of the methodologies discussed herein, according to some examples.

Examples will now be described with reference to the figures. FIG. 1 through FIG. 6 show examples of a hybrid PI as generally disclosed in the Moscone reference. FIG. 7 shows a further refinement of the blender used by a hybrid PI. FIG. 8 shows an example receiver environment in which the hybrid PI having the unified circuit can be used. FIG. 9A and FIG. 9B show an example blender implementation of the blending hybrid PI of FIG. 7. FIG. 10A and FIG. 10B show an example implementation of the unified circuit. FIG. 11 shows a flowchart of a method performed by a system using the unified circuit. FIG. 14 shows a machine potentially suited for implementation of one or more of the control and/or signal generation operations described herein.

With reference to FIG. 1, a hybrid phase interpolator 100 is shown. As shown, the hybrid phase interpolator 100 comprises a clock divider 102, phase interpolator mixers 104 and 106, an injection-locked ring 108, and output buffers 110. The hybrid phase interpolator 100, and variants and related techniques described below with reference to FIG. 2 through FIG. 6, corresponds to the hybrid PI described in the Moscone reference cited above.

The clock divider 102 receives an input clock signal at its input. The clock divider 102 generates an in-phase (I) clock signal (also referred to herein as the "I clock") and a quadrature (Q) clock signal (also referred to herein as the "Q clock") based on the input clock signal. The I clock corresponds to the input clock signal and the Q clock corresponds to a 90-degree phase shift of the input clock signal. The clock divider 102 provides the I clock at a first output and provides the Q clock at a second output. Although not illustrated in FIG. 1, the clock divider 102 may further generate and provide an inverse I clock (referred to herein as "~I clock") and an inverse of the Q clock (referred to herein as "~Q clock").

The outputs of the clock divider 102 are connected to inputs of the phase interpolator mixers 104 and 106 (although the direct connections of the clock divider 102 outputs to the interpolator mixer 106 are not shown for visual simplicity). The phase interpolator mixers 104 and 106 receive the I and Q clocks at their respective inputs. The phase interpolator mixers 104 and 106 use the I and Q clocks to generate injection signals to drive the injection-locked ring 108 based on different combinations of the I and Q clocks. The phase interpolator mixer 104 generates an injection signal 124 by mixing the clock signals according to a 100/0 mixing ratio (e.g., 100% of the I clock and 0% of the Q clock) to produce an injection signal that is in-phase with the I clock. The phase interpolator mixer 104 also generates an injection signal 126 that is the inverse of the injection signal 124 and is thereby in-phase with the ~I clock. The phase interpolator mixer 106 generates an injection signal 128 by mixing the clock signals according to a 50/50 mixing ratio (e.g., 50% of the I clock and 50% of the Q clock) to produce an injection signal that is phase offset with the I clock by 45 degrees. The phase interpolator mixer 106 also generates an injection signal 130 that is an inverse of the injection signal 128.

Figure 2:
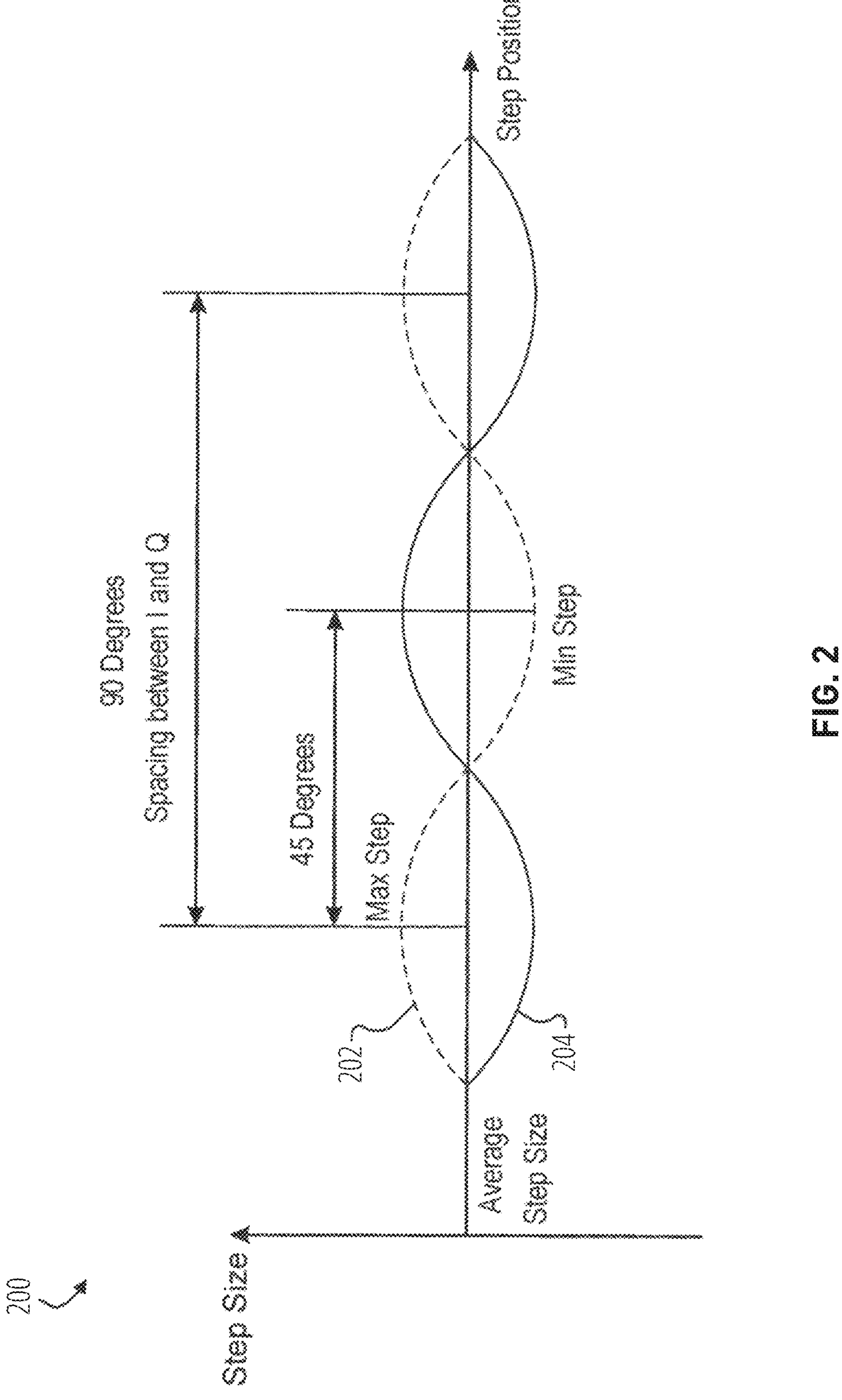
FIG. 2 is a plot illustrating step size curves associated with output signals of two phase interpolator mixer phase interpolators, which are included as part of the hybrid phase interpolators, according to some examples.

The injection signal 124 and injection signal 128 generated by the phase interpolator mixers 104 and 106, respectively, have inverse step size profiles. As a corollary, injection signal 126 and injection signal 130, which are simply the inverses of injection signal 124 and injection signal 128, also have inverse step size profiles. As used herein, a "step size profile" is a characteristic of an injection signal that describes a relationship between step size and phase position. As an example, FIG. 2 illustrates step size profiles of the injection signals output by the phase interpolator mixers 104 and 106. More specifically, in FIG. 2, a graph 200 of step size versus phase position is illustrated. Step size curves 202 and 204 are plotted within the graph 200. Step size curve 202 represents the step size profile of the injection signal 124 output by the phase interpolator mixer 104 and step size curve 204 represents the step size profile of the injection signal 128 output by the phase interpolator mixer 106. As shown, the step size curve 202 is an inverse of the step size curve 204. That is, the relationship between step size and phase position in the injection signal 124 is the inverse of the relationship between step size and phase position in the injection signal 128.

Returning to FIG. 1, the phase injection signal 124 and injection signal 126 provide the injection signals at their respective outputs. The outputs of the phase interpolator mixers 104 and 106 are connected to injection points of the injection-locked ring 108, and the injection-locked ring 108 generates output clock phases based on the injection signals provided by the phase interpolator mixers 104 and 106. By properly combining offset phase step curves in the phase interpolator mixers 104 and 106 with phase averaging provided by an injection-locked ring 108, a first order DNL and INL correction is achieved in the output clock phases. Rotational IQ skew errors generated by the phase interpolator mixers 104 and 106 are largely corrected in the injection-locked ring 108.

The injection-locked ring 108 comprises multiple delay stages. As shown, the injection-locked ring 108 comprises delay stages 112 to 118. Each of the delay stages 112 to 118 comprises at least one injection point.

The injection-locked ring 108 generates a characteristic oscillator signal. Each of the delay stages 112 to 118 contributes a finite delay, such that a time-delayed, or phase offset, version of the oscillator signal is established after each delay stage. Each of the delay stages 112 to 118 is of identical structure and configuration. Therefore, each of the delay stages 112 to 118 applies the same finite delay. The number of delay stages determines the amount of phase shift of each stage.

The oscillator signal undergoes a half cycle (0°-180°) total phase shift as it effectively 'travels' through the intervening delay stages in the first half of the injection-locked ring loop (e.g., clock signals Clk_0_p, Clk_45_p, Clk_90_p, Clk_135_p). Similarly, the oscillator signal undergoes the remaining half cycle of phase shift (180°-360°) as it effectively 'travels' the other half of the injection-locked ring loop (e.g., clock signals Clk_0_n, Clk_45_n, Clk_90_n, Clk_135_n). Thus, each half cycle is divided by n stage-to-stage phase shifts, or by a phase shift of 180°/n. Therefore, because four delay stages are employed, each delay stage would contribute a predetermined phase difference of 180°/4 or 45°.

As shown, the output of phase interpolator mixer 104 is connected to injection point 120 of the delay stage 112 and the output of phase interpolator mixer 106 is connected to injection point 122 of the delay stage 114. Accordingly, the injection signal 124 and injection signal 126 are injected into the injection point 120 of the delay stage 112, and the injection signal 128 and injection signal 130 are injected into the injection point 122.

The injection of the injection signal 124 and injection signal 126 to the injection point 120 causes the generated oscillator signal of the injection-locked loop to lock in both frequency and phase with the injection signal 124 and injection signal 126. Injection locking generally occurs when an oscillator operating at a certain frequency (e.g., the injection-locked ring 108) is disturbed by a second oscillator operating at a different but very close frequency (e.g., the injection signal 124 and injection signal 126) such that the coupling effects yield a locking of the first oscillator to the second oscillator. If the frequencies are sufficiently close and the coupling sufficiently strong, such injection locking will consistently occur in much the same manner that the vibrating strings of two instruments will eventually synchronize in vibration frequency if they are similarly tuned and drawn close enough together.

Because the injection signal 124 and injection signal 126 are injected at the delay stage 112, the injection-locked version of the oscillator signal resulting at the delay stage 112 is in-phase with the injection signal 124 and injection signal 126. Accordingly, after the first delay stage 112, the oscillator signal at the first half of the loop (i.e., Clk_0_p) and the other half of the loop (i.e., Clk_0_n) is not delayed with respect to the injection signal 124 and injection signal 126. Further, the injection-locked versions of the oscillator signal after the other delay stages would be accordingly referenced in phase to the first delay stage 112. For example, after the second delay stage 114, the oscillator signal at the first half of the loop (i.e., Clk_45_p) and the other half of the loop (i.e., Clk_45_n) is delayed by 45°. Similarly, after the third delay stage 116 and fourth delay stage 118, the oscillator signal is delayed by 90° and 135°, respectively.

At injection point 120, as the phase interpolator mixer 104 rotates, large phase steps eventually turn into smaller steps. Correspondingly at injection point 122, as the phase interpolator mixer 106 rotates, small phase steps eventually turn into larger steps because, as noted above, the step size profile of the injection signal provided by the phase interpolator mixer 106 is the inverse of the step size profile of the injection signal provided the phase interpolator mixer 104. The injection-locked ring 108 rotates in such a manner that its instantaneous phase rotation value is equal to the average value of the two steps applied to the injection points 120 and 122, thereby producing the first-order step size correction, and corresponding INL improvement in the output clock phases generated by the injection-locked ring 108.

The injection-locked ring 108 is configured to be a phase-follower only; it does not inherently rotate. By not inherently rotating, the injection-locked ring 108 does not add any DNL, INL, or interphase skew errors back into the output clock phases.

The injection-locked ring 108 provides the output clock phases at its outputs. The outputs of the injection-locked ring 108 are connected to inputs of the output buffers 110. The output buffers 110 provide a second stage of skew correction through utilization of one or more blending techniques. The output buffers 110 further convert the output clock phases generated by the injection-locked ring 108 to complementary metal-oxide-semiconductor (CMOS) clock phases.

Figure 3:
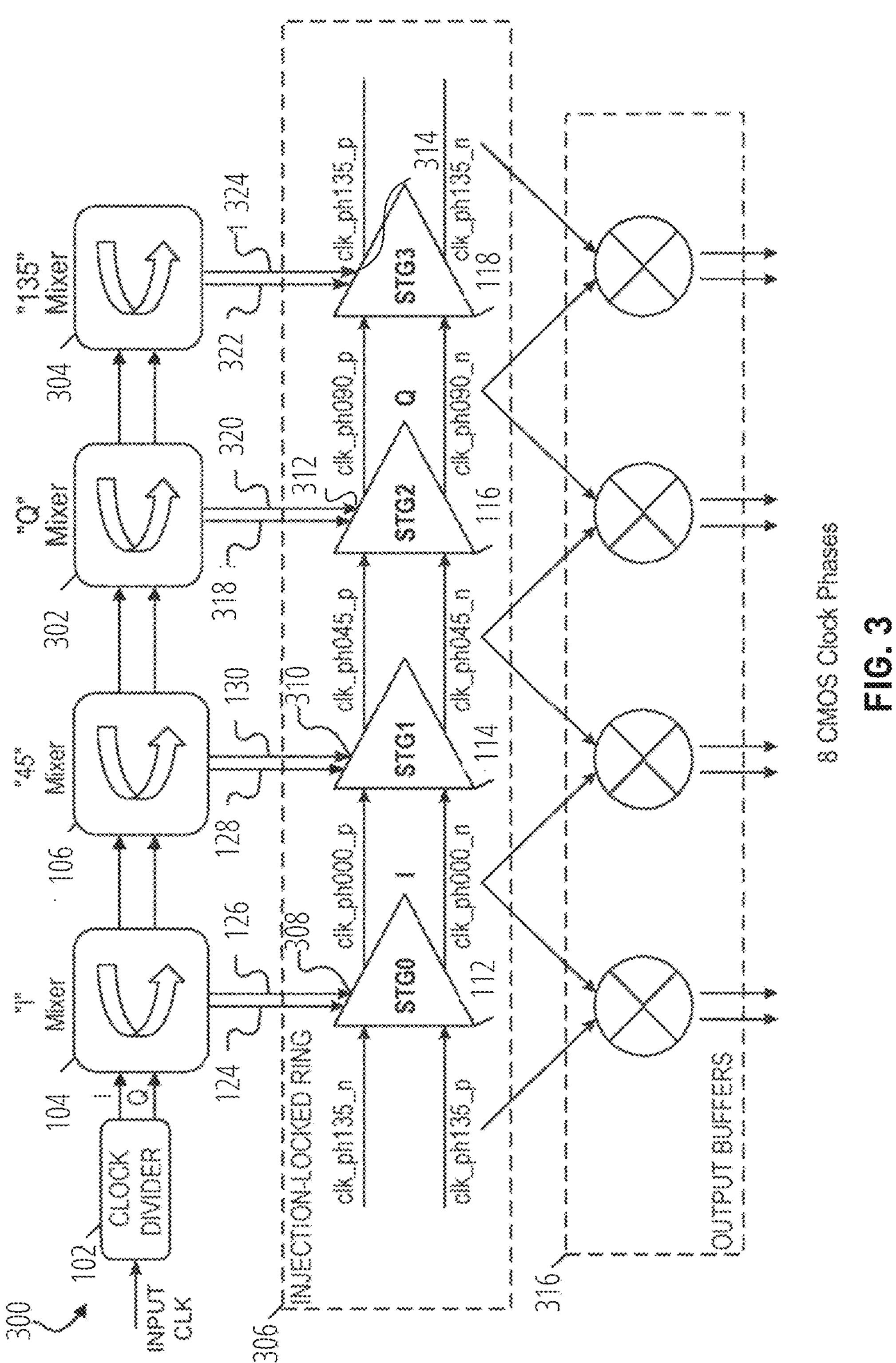
FIG. 3 is a circuit diagram illustrating a hybrid phase interpolator, according to some examples.

As shown in FIG. 3, a variant hybrid phase interpolator 300 of the hybrid phase interpolator 100 of FIG. 1 may, in some embodiments, further include phase interpolator mixers 302 and 304. As with the phase interpolator mixers 104 and 106, the phase interpolator mixers 302 and 304 receive the I and Q clocks at their respective inputs and use the I and Q clocks to generate injection signals to drive the injection-locked ring 306 based on different combinations of the I and Q clocks. In particular, the phase interpolator mixer 302 generates an injection signal 318 by mixing the clock signals according to a 0/100 mixing ratio (e.g., 0% of the I clock and 100% of the Q clock) to produce an injection signal that is in-phase with the Q clock, which as noted above, is in quadrature with the I clock. The phase interpolator mixer 302 also generates an injection signal 320 that is the inverse of the injection signal 318 and is thereby in-phase with the ~Q clock. The phase interpolator mixer 304 generates an injection signal 322 by mixing the clock signals according to a 50/50 mixing ratio (e.g., 50% of the I clock and 50% of the Q clock) to produce an injection signal that is phase offset with the Q clock by 45 degrees and thus phase offset with the I clock by 135 degrees. The phase interpolator mixer 304 also generates an injection signal 324 that is the inverse of the injection signal 322. As with the injection signal 124 and injection signal 128, the injection signal 318 and injection signal 322 have inverse step profiles.

As shown, the phase interpolator mixers 302 and 304 provide the injection signals at their respective outputs. The outputs of the phase interpolator mixers 302 and 304 are connected to injection points of the injection-locked ring 306. In particular, the outputs of interpolator mixer 302 are connected to the injection point of delay stage 116 and the outputs of phase interpolator mixer 304 are connected to the injection point of delay stage 118. Accordingly, the injection signal 318 and injection signal 320 are injected into the injection point of the delay stage 116, and the injection signal 322 and injection signal 324 are injected into the injection point of the delay stage 118. The injection-locked ring 306 generates output clock phases based on the injection signals provided by the phase interpolator mixers 104 to 304 in the same manner as described above with reference to FIG. 1.

Figure 4A:
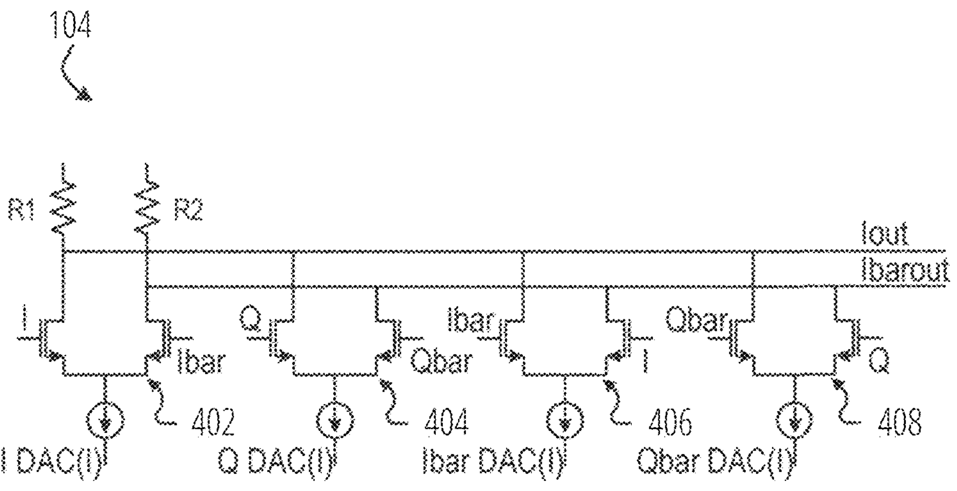
FIG. 4A and FIG. 4B are circuit diagrams illustrating phase interpolator mixers, which are provided as part of the hybrid phase interpolator, according to some examples.

FIG. 4A is a circuit diagram illustrating the phase interpolator mixer 104 included in the hybrid phase interpolator 100. As illustrated in FIG. 4A, the phase interpolator mixer 104 includes differential amplifier 402 to 408 and load resistors R1 and R2. Differential amplifier 402 includes first and second n-channel metal-oxide-semiconductor (NMOS) transistors. As shown, the source nodes of the first and second NMOS transistors are connected to a digital-to-analog controller (DAC) for the I clock. Further, the drain nodes of the first and second NMOS transistors are connected to the resistors R1 and R2. In addition, the first NMOS transistor (e.g., left transistor) receives the I clock at its gate node and the second NMOS transistor (e.g., right transistor) receives an ~I clock at its gate node. In an embodiment, resistors R1 and R2 are of equal resistance.

In some embodiments, differential amplifiers 404 to 408 are similar in structure to differential amplifier 402. However, as illustrated in FIG. 4A, (i) the first and second NMOS transistors receive different clocks at their respective gate nodes and (ii) the source nodes of the respective first and second NMOS transistors are connected to different DACs. For example, with regard to the differential amplifier 404. (i) the source nodes of the first and second NMOS transistors are connected to a DAC associated with the Q clock and (ii) the first NMOS transistor receives a Q clock at its gate node and the second NMOS transistor receives a ~Q clock at its gate node. Further, with regard to the differential amplifier 406, (i) the source nodes of the first and second NMOS transistors are connected to a DAC associated with the ~I clock and (ii) the first NMOS transistor receives an ~I clock at its gate node and the second NMOS transistor receives an I clock at its gate node. Lastly, with regard to the differential amplifier 408, (i) the source nodes of the first and second NMOS transistors are connected to a DAC associated with the ~Q clock and (ii) the first NMOS transistor receives a ~Q clock at its gate node and the second NMOS transistor receives a Q clock at its gate node.

The drain node of the first NMOS transistor of the differential amplifier 402 is connected to the drain node of the first NMOS transistor of each of the differential amplifiers 404 to 408. Similarly, the drain node of the second NMOS transistor of the differential amplifier 402 is connected to the drain node of the second NMOS transistor of each of differential amplifier 404 to 408.

Output injection signals (e.g., the injection signal 124 and an inverse of the injection signal 124) are interpolated between the clocks received at the first and second NMOS transistors of each of the differential amplifiers 402 to 408. Specifically, the interpolator mixer 104 generates the injection signals based on the currents at the I, ~I, Q, and ~Q DACs. Accordingly, the output injection signals can be positioned anywhere within a 1-clock-period interval (which may correspond to 2 data bits in a half-rate system, or 4 data bits in a quarter-rate system).

Further, only two adjacent differential amplifiers are ever on at once: (i) differential amplifier 402 and 404 or (ii) differential amplifier 404 and 406 or (iii) differential amplifiers 406 and 408 or (iv) differential amplifier 408 and 402. Therefore, because the input clocks between differential amplifiers are in quadrature, the output injection signals will also be in quadrature. For example, if the I DAC current (i.e., differential amplifier 402) is nonzero but the Q DAC current (i.e., differential amplifier 404) is zero, then the injection signal 124 will be aligned with the I input clock. Similarly, if the I DAC current is zero but the Q DAC current is nonzero, then the injection signal 124 will be aligned with the Q input clock. However, if (i) the I DAC current is equal to the Q DAC current, then the injection signal 124 will be phase-aligned half-way between the I and Q input clocks. In other words, as the 1 DAC current is gradually decreased and the Q DAC current is gradually increased, that phase of the injection signal moves from being aligned with the I input clock towards being aligned with the Q input clock. In this manner, the phase interpolator mixer 104 generates a new "interpolated" output clock as the injection signal 124. Further, as mentioned previously above, the inverse of the injection signal 124 will include the same phase as the injection signal 124 but will be of opposite polarity.

Figure 4B:
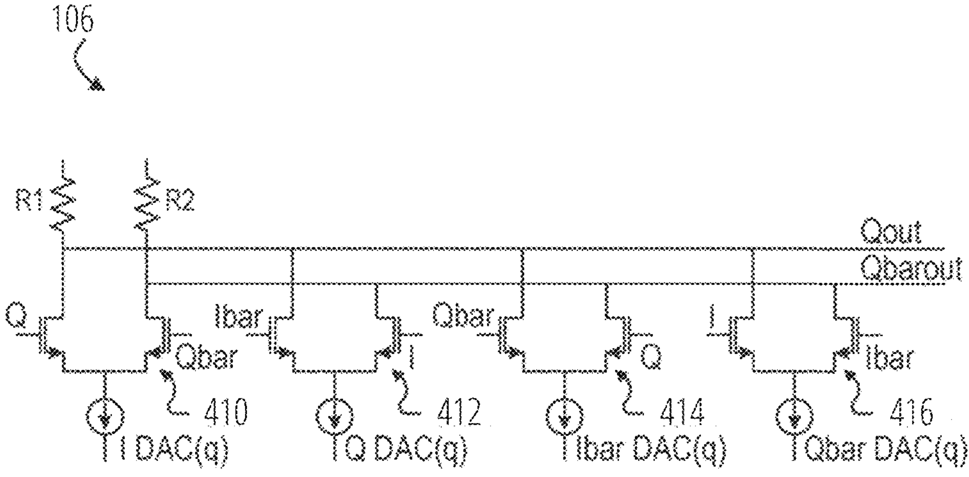

FIG. 4B is a circuit diagram illustrating the phase interpolator mixer 106 included in the hybrid phase interpolator 100. The phase interpolator mixer 106 is similar in structure to the phase interpolator mixer 104 except that the differential amplifiers 410 to 416 receive different input clocks than the differential amplifiers 402 to 408. For example, with regard to the differential amplifier 410, the first NMOS transistor receives a Q clock at its gate node and the second NMOS transistor receives a ~Q clock at its gate node. Further, with regard to the differential amplifier 412, the first NMOS transistor receives an ~I clock at its gate node and the second NMOS transistor receives an I clock at its gate node. Further, with regard to the differential amplifier 414, the first NMOS transistor receives a ~Q clock at its gate node and the second NMOS transistor receives a Q clock at its gate node. Lastly, with regard to the differential amplifier 416, the first NMOS transistor receives an I clock at its gate node and the second NMOS transistor receives an ~I clock at its gate node.

Figure 5:
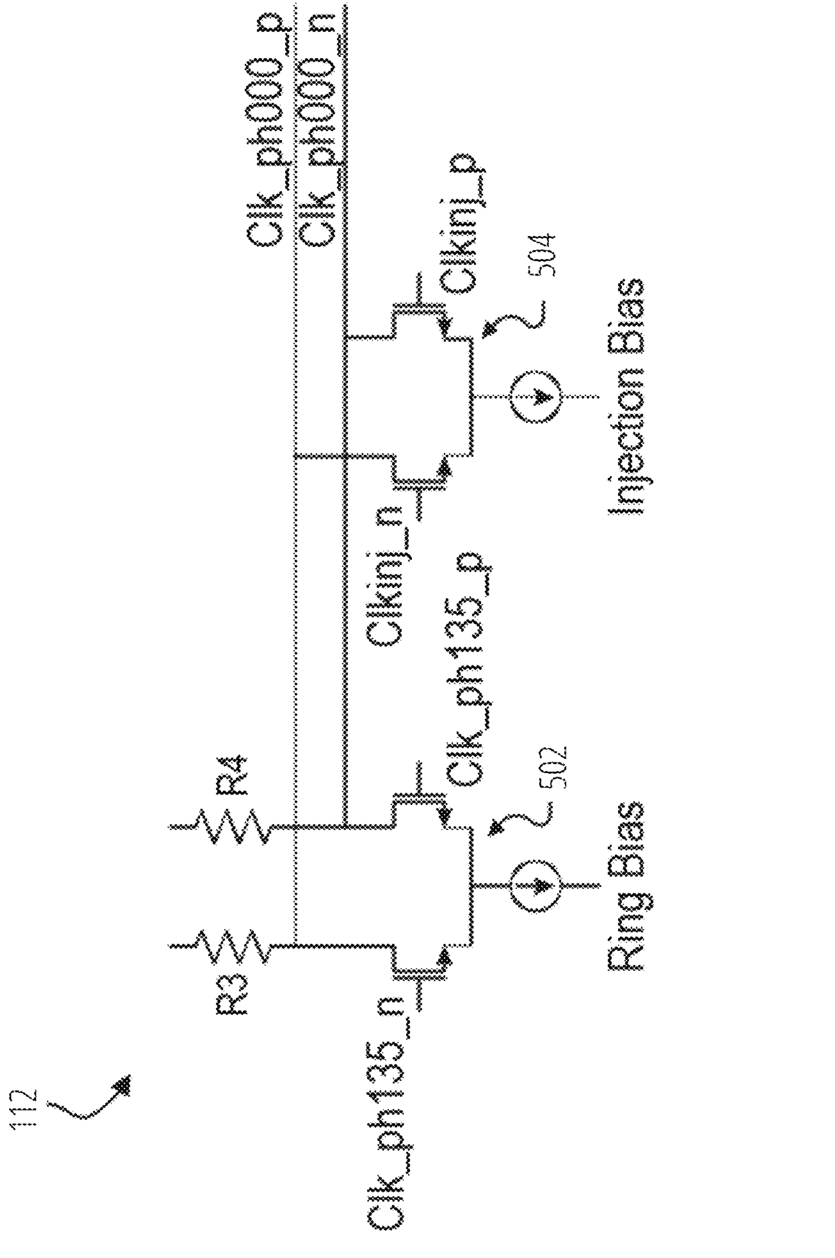
FIG. 5 is a circuit diagram illustrating a delay stage of an injection-lock ring, which is provided as part of the hybrid phase interpolator, according to some examples.

FIG. 5 is a circuit diagram illustrating a delay stage of the injection-locked ring 108, which is provided as part of the hybrid phase interpolator 100. Specifically, FIG. 5 depicts the first delay stage 112. The first delay stage 112 includes differential amplifiers 502 and 504 and load resistors R3 and R4. In some embodiments, resistors R3 and R4 are of equal resistance. In an embodiment, differential amplifier 502 includes first and second NMOS transistors.

As further illustrated in FIG. 5, the source nodes of the first and second NMOS transistors are connected to a bias current for the injection-locked ring 108. Further, the drain nodes of the first and second NMOS transistors are connected to the resistors R3 and R4. In addition, the first NMOS transistor (e.g., left transistor) receives clock signal Clk_135_n at its gate node and the second NMOS transistor (e.g., right transistor) receives clock signal Clk_135_p at its gate node. In an embodiment, with regard to the differential amplifier 504, (i) the source nodes of the first and second NMOS transistors are connected to an injection bias current and (ii) the first NMOS transistor receives an inverse of the injection signal 124 (e.g., ~I clock) at its gate node and the second NMOS transistor receives the injection signal 124 (e.g., I clock) at its gate node.

Further. (i) the drain node of the first NMOS transistor of the differential amplifier 502 is connected to the drain node of the first NMOS transistor of the differential amplifier 502 and (ii) the drain node of the second NMOS transistor of the differential amplifier 502 is connected to the drain node of the second NMOS transistor of the differential amplifier 504. In an embodiment, the first delay stage 112 is able to lock the clock signals Clk_0_p and Clk_0_n to the injection signals (i.e., the injection signal 124 and the inverse of the injection signal 124) based on the ring and injection bias currents.

The ring oscillator's bias current is typically calibrated along with the value of the load resistors (i.e., R3 and R4) through a digital calibration loop at startup, so as to force the ring oscillator to have a natural oscillation frequency which is as close to the injection frequency as possible. This places the ring oscillator, when injection-locked, within the center of its lock range. If the injection signal frequency is increased (or decreased) beyond a certain value, above or below this calibrated natural ring oscillation frequency, then the loop will lose lock since the ring oscillator is trying to naturally oscillate at a point which is too far away from the driving injection frequency. The ring's natural oscillation frequency depends on the load resistance and capacitance at the output of each delay stage.

Further, the ring oscillator's voltage swing and loop gain depends partly on the bias current and load resistor values. The injection bias current is typically some fraction of the calibrated ring oscillator bias, having sufficient strength to allow the injection differential pair (e.g., 500) to "pull" the ring oscillator stage into phase alignment with the injection signals (i.e., the injection signal 124 and the inverse of the injection signal 124). The injection bias must be strong enough to allow the injection signal to lock the ring oscillator (stronger injection biases help maximize the lock range). For example, the ring bias may range anywhere from several hundred microamps (e.g., for a 500 MHz natural frequency) to several milliamps (e.g., for a 5 GHz to 10 GHz natural frequency). Further, a typical value for the injection bias would be one-quarter of the respective ring bias. Consistent with some embodiments, the other delay stages 114 to 118 include circuit structures essentially identical to the delay stage 112. However, the other delay stages do not receive the same injection signals as the delay stage 112. For example, as noted above, the delay stage 114 receives the injection signal 126.

Figure 6:
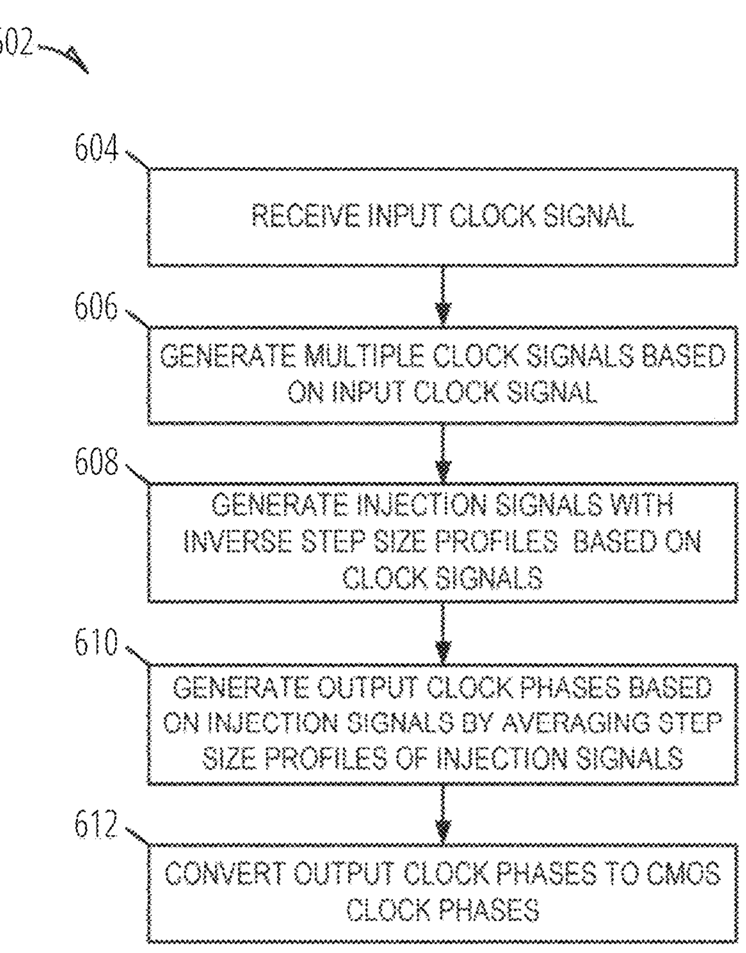
FIG. 6 is a flow diagram illustrating operations of the hybrid phase interpolator in performing a method for generating multiple clock phases using constant step sizes, according to some examples.

FIG. 6 is a flow diagram illustrating operations of the hybrid phase interpolator 100 in performing a method 602 for generating multiple clock phases using constant step sizes. At operation 604, the clock divider 102 receives an input clock signal. The input clock signal may be generated by a clock generator.

At operation 606, the clock divider 102 generates at least two clock signals based on the input clock signal. For example, the clock divider may generate a first clock signal that is in-phase with the input clock signal (e.g., the I clock), and a second clock signal that is phase offset with the input clock signal by 90 degrees (e.g., the Q clock). In light of the phase shift, the first and second clock signal are in quadrature with one another. The clock divider may further generate a third clock signal that is an inverse of the first clock signal (e.g., the ~I clock), and a fourth clock signal that is an inverse of the second clock signal (e.g., the ~Q clock).

At operation 608, the phase interpolator mixers 104 to 304 generate injection signals based on the first and second clock signal generated by the clock divider 102. In generating the injection signals, the phase interpolator mixer 104 generates a first injection signal (e.g., injection signal 124) that is in-phase with the first clock signal. The phase interpolator mixer 104 generates the injection signal 124 by combining the first and second clock signal according to a first combination. For example, the phase interpolator mixer 104 may generate the injection signal 124 by combining the first and second clock signals at a 100/0 mixing ratio (e.g., 100% first clock signal and 0% second clock signal).

The phase interpolator mixer 106 generates a second injection signal (e.g., injection signal 128) that corresponds to a phase shift of the first clock signal (e.g., a 45-degree phase shift). The phase interpolator mixer 106 generates the second injection signal by combining the first and second clock signal according to a second combination. For example, the phase interpolator mixer 106 may generate the second injection signal 128 that corresponds to a 45-degree phase shift of the first clock signal by combining the first and second clock signals at a 50/50 mixing ratio (e.g., 50% first clock signal and 50% second clock signal). By generating the injection signals in this manner, the first and second injection signals 124 and 128 have a 45-degree phase difference.

In addition, by generating the first and second injection signals 124 and 128 in this manner, the first injection signal 124 and the second injection signal 128 have inverse step size profiles. As noted above, the step size profile describes a relationship between step size and phase position. Thus, the relationship between step size and phase position in the first injection signal is the inverse of the relationship between step size and phase position in the second injection signal.

Consistent with some embodiments, the phase interpolator mixer 104 may further generate a third injection signal (e.g., injection signal 126) that is an inverse of the first injection signal, and the phase interpolator mixer 106 may further generate a fourth injection signal (e.g., injection signal 130) that is an inverse of the second injection signal.

At operation 610, the injection-locked ring 108 generates output clock phases based on the injection signals. In generating the output clock phases, the injection-locked ring 108 averages the step size profiles of the injection signals. As noted above, the first and second injection signals have inverse step size profiles. Thus, by averaging the inverse step size profiles, the injection-locked ring 108 generates output clock phases using constant step sizes. The output clock phases may include at least a first and second output clock phase that are offset by 45 degrees. The output clock phases further include: a third output clock phase that is offset with first output clock phase by 90 degrees; a fourth output clock phase that is offset with the first output clock phase by 135 degrees; a fifth output clock phase that is offset with the first output clock phase by 180 degrees; a sixth output clock phase that is offset with the first output clock phase by 225 degrees; a seventh output clock phase that is offset with the first output clock phase by 270 degrees; and an eighth output clock phase that is offset with the first output clock phase by 315 degrees.

At operation 612, the output buffers 110 convert the output clock phases to complementary metal-oxide-semiconductor (CMOS) clock phases. In converting the output clock phases, the output buffers 110 may utilize blending techniques to reduce static and rotating skews in the CMOS clock phases.

FIG. 7 is a block diagram illustrating a blending hybrid phase interpolator 700 with blending buffers 706 and 708. The blending hybrid phase interpolator 700 is a further variant of the hybrid phase interpolator 300 of FIG. 3.

As in the hybrid phase interpolator 100 and hybrid phase interpolator 300, the blending hybrid phase interpolator 700 includes a clock divider 102 that receives an input clock signal. The clock divider 102 generates multiple clock signals including in-phase (I) and quadrature (Q) clock signals based on the input clock signal. In some examples, the clock divider 102 may further generate inverse I clock and inverse Q clock signals.

As in the hybrid phase interpolator 300, the blending hybrid phase interpolator 700 includes multiple phase interpolator mixers (104, 106, 302, 304) that receive the clock signals from the clock divider 102. Each phase interpolator mixer generates injection signals based on different combinations of the I and Q clocks. For example, the phase interpolator mixer 104 generates injection signals by mixing clock signals according to a 100/0 mixing ratio to produce an in-phase signal, while interpolator mixer 106 uses a 50/50 mixing ratio to produce a 45-degree phase shifted signal.

As in the hybrid phase interpolator 300, an injection-locked ring 108 receives the injection signals from the phase interpolator mixers. The injection-locked ring 108 comprises multiple delay stages (112, 114, 116, 118) that each contribute a finite delay. Each delay stage includes at least one injection point for receiving the injection signals. The injection-locked ring 108 generates output clock phases based on averaging the step size profiles of the injection signals.

A blender 704 processes the output clock phases from the injection-locked ring 108. The blender 704 includes blending buffers 706 and 708 that weight multiple input phases to create output phases. The blending buffers provide adjustable weighting that enables phase movement at the output. The blending buffers 706 and 708 generate four CMOS clock phases at their outputs.

In some examples, the blending buffers 706 and 708 may provide a blending range enabling the blender delay values to span at least 1.5 unit intervals of input data in a quarter rate system. The blending operation reduces static and rotating skews in the output clock phases.

Collectively, the components from the clock divider 102 through the injection-locked ring 108 are referred to herein as the PI 702 or PI block. The blending buffer 706 and blending buffer 708 are referred to as the blender 704 or blender block.

FIG. 8 is a block diagram illustrating a receiver path 800 with phase interpolator and blender control for controlling the blending hybrid phase interpolator 700.

The receiver path 800 includes a continuous time linear equalizer (CTLE) 802 that receives and conditions a data signal 820. The conditioned data signal is provided to an analog-to-digital converter (ADC) 804 that converts the analog signal to digital form. A feed-forward equalizer (FFE) 806 processes the digitized signal to compensate for channel effects. A clock and data recovery (CDR) circuit 808 receives the equalized digital signal from the FFE 806.

The CDR circuit 808 generates PI phase codes 814 that control a phase interpolator (PI), which can be implemented as the PI 702 of FIG. 7. The PI 702 generates sampling phases 816 (shown as a bus carrying 8 signals) used to sample the received data. The CDR circuit 808 maintains proper timing relationships between the data signal and sampling phases 816 by adjusting the PI phase code 814.

As shown, the CDR circuit 808 interfaces with both the PI 702 and the blender 704 of the blending hybrid phase interpolator 700 of FIG. 7 to maintain proper timing relationships. The PI phase code 814 from the CDR circuit 808 determines the phase interpolator settings, as described above with reference to FIG. 7.

The blender 704 generates phase-shifted clock signals 818, shown as a bus carrying four signals. A blender control circuit 810 provides a blender control signal 812 to the blender 704 to adjust the blender weights and thereby the blender delay.

It will be appreciated that the number of sampling phases 816 and/or phase-shifted clock signals 818 can be varied in various examples, some of which are described below with reference to FIG. 10A and FIG. 10B.

FIG. 9A is a schematic diagram illustrating the functioning of an I-path blender 902 and a Q-path blender 904 used in a blending hybrid phase interpolator, such as the blending hybrid phase interpolator 700 of FIG. 7. In some examples, the I-path blender 902 corresponds to the blending buffer 706 and the Q-path blender 904 corresponds to the blending buffer 708; however, it will be appreciated that the blending functionality of the I-path blender 902 and Q-path blender 904 can be used in the output buffers of other variants of the hybrid PI, such as hybrid phase interpolator 100 or hybrid phase interpolator 300, using various numbers of inputs and various phase values of the inputs. For example, in an 8 clock phase system, four blending buffers can be used to blend each of the four differential pairs of phase-shifted clock inputs.

In the illustrated example, the I-path blender 902 is performing a 50/50 blend between its −45° and 0° phase inputs to generate a −22.5° output phase, and the Q-path blender 904 is performing a 50/50 blend between its 45° and 90° phase inputs to generate a 67.5° output phase. Each of the phases generated in FIG. 9A, as described above, also includes a 180-degree complementary phase for providing a differential pair of 180-degree phase-shifted clock signals.

FIG. 9B is a circuit diagram illustrating an example circuit implementation of the I-path blender 902 of FIG. 9A. The Q-path blender 904 can be understood as having a similar implementation, with different inputs.

The I-path blender 902 includes a first tuning resistor 906 and a second tuning resistor 908 coupled to a voltage supply node Vdd. The tuning resistors 906 and 908 connect to differential pair of transistors with complementary signals that provide the phase-shifted clock signals.

The circuit includes two such differential pairs of transistors: a −45° differential pair 910 receiving a phase-shifted clock signal at −45° phase, and a 0° differential pair 912 receiving a phase-shifted clock signal at 0° phase. During normal operation as a blending buffer, the I-path blender 902 (along with the Q-path blender 904) combines equal-strength phase-shifted clocks to generate phase-shifted clock signals 818.

A current source 916 is coupled between each differential pair and ground 918. The current sources 916 may be scaled together with the tuning resistors 906 and 908 based on operating frequency. A switch 914 is positioned between each differential pair and the current source 916 to enable control of the current paths; in some examples, the switches 914 and current sources 916 can have their positions reversed.

The I-path blender 902 can function as part of a blending buffer (e.g., 706 or 708) in the blending hybrid phase interpolator 700, combining two equal-strength phase-shifted clocks and correcting systematic skews present in the input clock. The 45-degree phase relationships between inputs may enable better linearity compared to 90-degree implementations while maintaining equal loading of clock phases.

In some examples, the I-path blender 902 is powered using a regulator (not shown) to minimize or reduce supply-noise induced jitter feeding into a CML-to-CMOS conversion stage (e.g., part of ADC 804) following the blender 704.

As noted above, systems using different numbers of clock phases can use different numbers of blenders. Instead of the two blenders 902 and 904 shown in FIG. 9A, an 8 clock phase implementation can use four blenders to separately blend each of the four pairs of inputs.

Figure 10A:
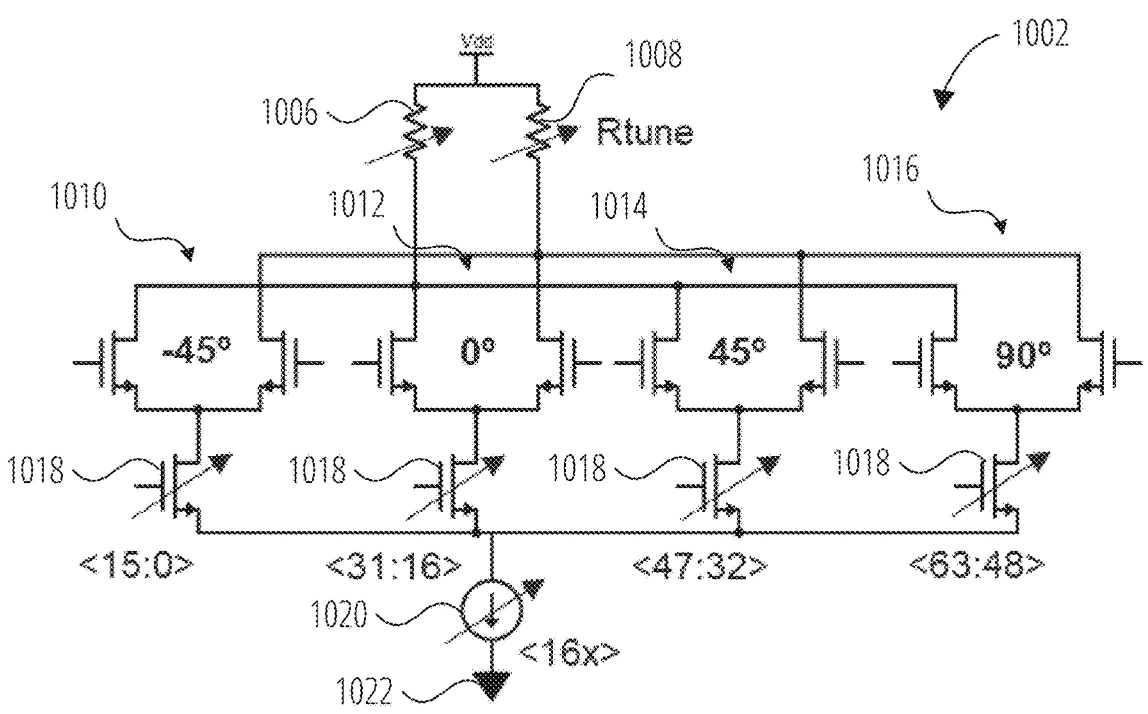
FIG. 10A is a circuit diagram illustrating an I-path blender/eye-surf mixer with control code inputs and phase range coverage, according to some examples.
Figure 10B:
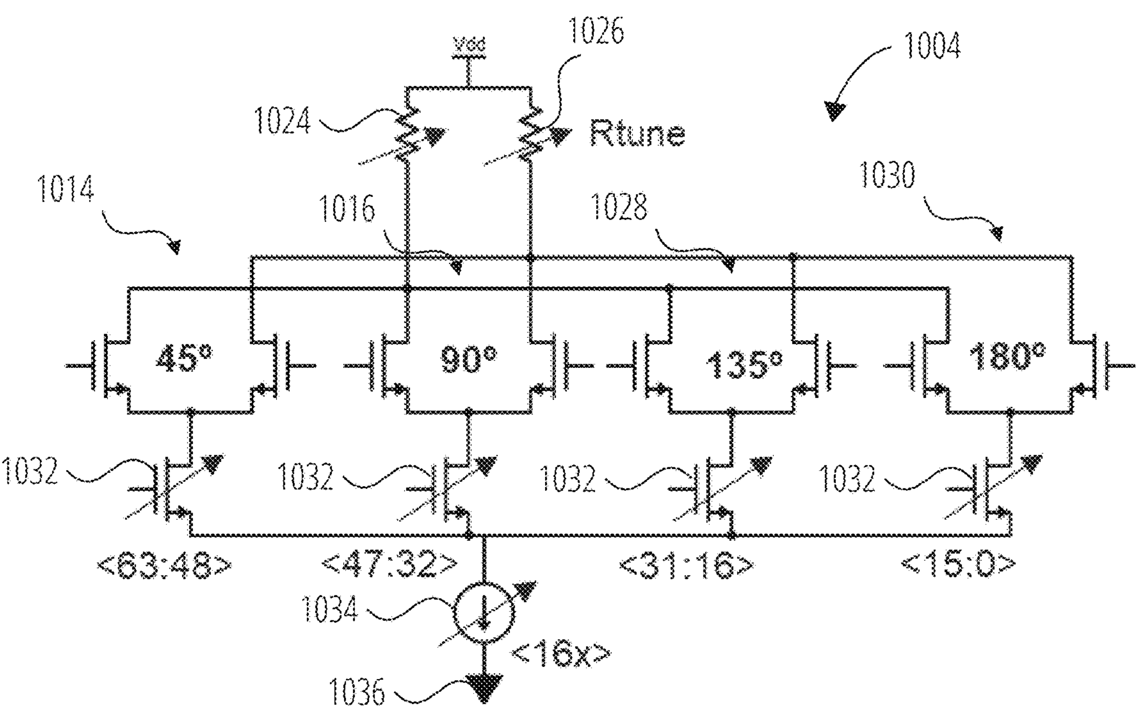
FIG. 10B is a circuit diagram illustrating a Q-path blender/eye-surf mixer with inverted control code inputs for opposite directional movement, according to some examples.
Figure 11:
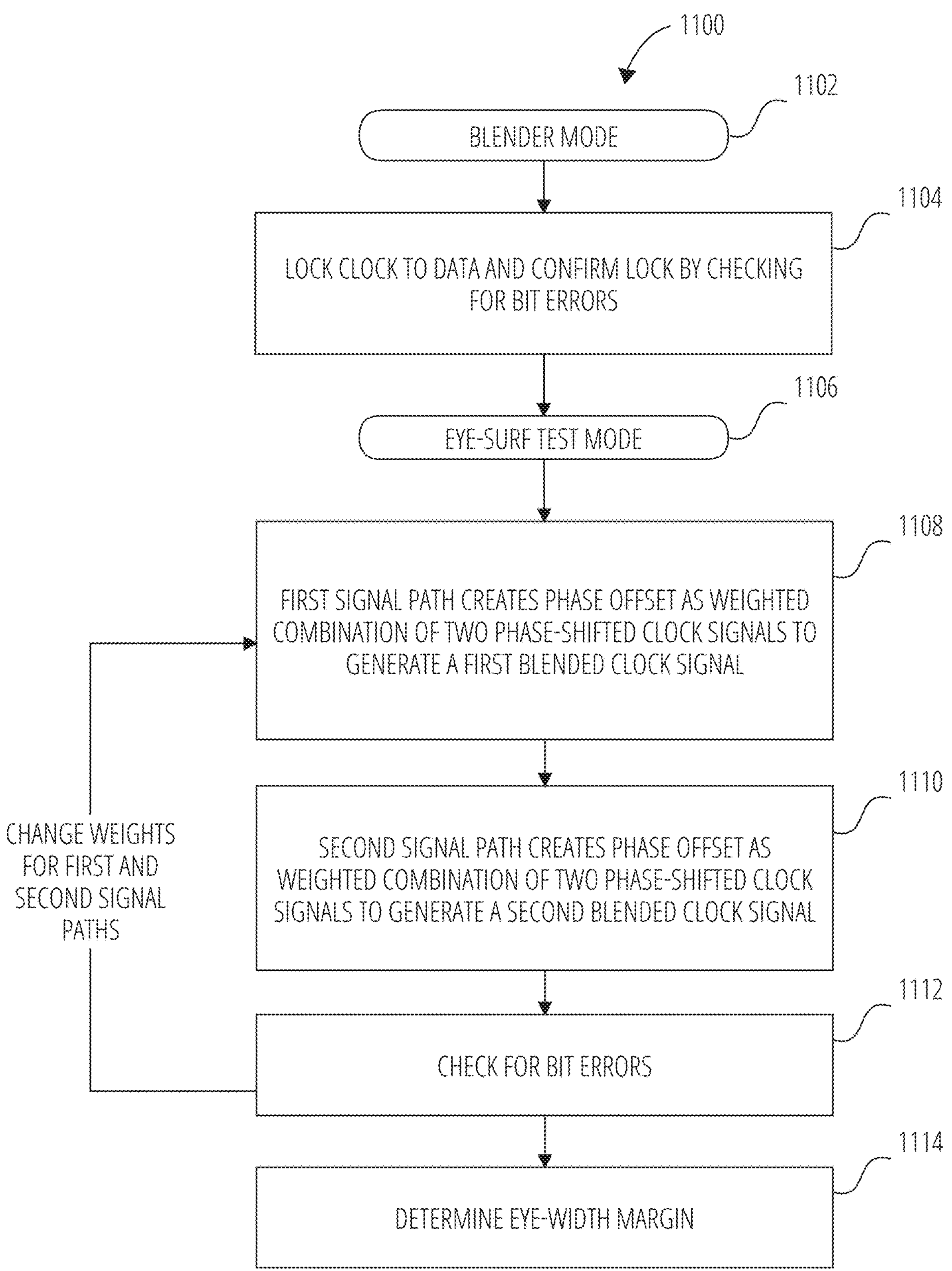
FIG. 11 is a flow diagram illustrating operations for testing eye-width margin using unified blender and eye-surf functionality, according to some examples.

Whereas FIG. 9A and FIG. 9B illustrate an example implementation of blending buffers for a blending hybrid PI, FIG. 10A and FIG. 10B are now described, illustrating an example implementation of a unified blender/eye-surf circuit that can be used in place of the blender circuit implementation shown in FIG. 9B.

FIG. 10A is a circuit diagram illustrating an I-path blender/eye-surf mixer 1002 with control code inputs and phase range coverage.

The I-path blender/eye-surf mixer 1002 includes first tuning resistor 1006 and second tuning resistor 1008 coupled to a voltage supply node Vdd. A first tuning resistor 1006 and a second tuning resistor 1008 connect to differential outputs that provide phase-shifted clock signals.

The −45° differential pair 1010, 0° differential pair 1012, 45° differential pair 1014, and 90° differential pair 1016 receive phase-shifted clock input signals phase-shifted from each other by 45 degrees, as in the I-path blender 902 of FIG. 9B.

Switches 1018 couple to the differential pairs to enable control of the current paths. During normal operation as a blender, the I-path blender/eye-surf mixer 1002 combines equal-strength phase-shifted clocks to generate output phases.

A current source 1020 provides bias current that may be scaled together with the tuning resistors 1006 and 1008 based on operating frequency. The current source 1020 connects between the differential pairs and a ground 1022.

The I-path blender/eye-surf mixer 1002 functions as part of the unified circuit, combining phase-shifted clocks during normal operation and creating controlled phase offsets during test mode. In some examples, the positions of the current source 1020 and switch 1018 may be interchanged while maintaining the same functionality.

The example I-path blender/eye-surf mixer 1002 can support both current mode logic operation for potentially improved linearity, as well as voltage mode operation for potentially improved power consumption. The I-path blender/eye-surf mixer 1002 is powered using a regulator to minimize supply-noise induced jitter feeding into the CML-to-CMOS conversion stage.

Each differential pair in the I-path blender/eye-surf mixer is controlled by a 16-bit phase code segment that can enable precise weighting of the phase-shifted clock signals. The −45° differential pair 1010 receives control inputs <15:0>, the 0° differential pair 1012 receives <31:16>, the 45° differential pair 1014 receives <47:32>, and the 90° differential pair 1016 receives <63:48>. In the example eye-surf encoding scheme described above, at a mid-phase code 24, eight bits from each of two adjacent phase code segments are active to achieve equal weighting between phases, resulting in the desired interpolated output phase.

For example, when operating in a blender mode (also referred to herein as a normal mode) as a phase blender, eight bits each from <31:16> and <47:32> are enabled to generate a 22.5° output phase by equally combining the 45° and 0° inputs (45° differential pair 1014 and 0° differential pair 1012). When operating in an eye-surf test mode (also referred to herein as an eye-surf mode or test mode) as an eye-surf circuit, the I-path blender/eye-surf mixer 1002 blends variable ratios of sets of two adjacent differential pairs (e.g., according to the weight ratios shown in the eye-surf encoding table above) to generate an output signal having variable phases (e.g., spanning the range of −45° to 90°).

The phase codes can be scaled together to maintain constant total current while adjusting the relative weighting between differential pairs to achieve the desired phase interpolation. In some examples, as described above, the I-path spans phase shifts over 135 degree from −45 to 90 degrees, and the Q-path spans phase shifts over 135 degrees from 45 to 180 degrees. I and Q are skewed in opposite directions to obtain 270-degree phase skew overall for eye-surf operation, such that the unified blender and eye-surf circuit provides a 270-degree phase range using only eye-surf codes 0-47 (codes 48:63 being unused). This 270-degree range is sufficient for margin testing applications.

FIG. 10B is a circuit diagram illustrating a Q-path blender/eye-surf mixer 1004 with inverted control code inputs for opposite directional movement relative to the I-path blender/eye-surf mixer 1002 of FIG. 10A.

In the illustrated example, the structure of the Q-path blender/eye-surf mixer 1004 is essentially the same as the I-path blender/eye-surf mixer 1002: a first tuning resistor 1024 and second tuning resistor 1026 coupled between Vdd and four differential pairs; four switches 1032 between the differential pairs and the current source 1034, which is coupled to ground 1036. However, the inputs providing the signals to the differential pairs are different from those received by I-path blender/eye-surf mixer 1002: Q-path blender/eye-surf mixer 1004 includes the 45° differential pair 1014, the 90° differential pair 1016, a 135° differential pair 1028, and a 180° differential pair 1030.

In addition, the differential pairs of Q-path blender/eye-surf mixer 1004 are controlled by different 16-bit phase code segments: the switch 1032 for the 180° differential pair 1030 receives control inputs <15:0>, the switch 1032 for the 180° differential pair 1030 receives <31:16>, the switch 1032 for the 90° differential pair 1016 receives <47:32>, and the switch 1032 for the 45° differential pair 1014 receives <63:48>. This inversion of the order of the eye-surf controls of the unified circuit may be referred to herein as controlling the unified circuit using an inverted version of the eye-surf code.

This means that, for example, when operating in the blender mode, using the example eye-surf encoding scheme described above, at a mid-phase code 24, eight bits each from <31:16> and <47:32> are enabled to generate the 112.5° output phase by equally combining the 90° and 135° inputs (90° differential pair 1016 and 135° differential pair 1028). When operating in the eye-surf test mode, the Q-path blender/eye-surf mixer 1004 blends variable ratios of sets of two adjacent differential pairs (e.g., according to the weight ratios shown in the eye-surf encoding table above) to generate an output signal having variable phases (e.g., spanning the range of 180° to) 45°. The I-Q clock skew can be swept across a range of values during eye-surf testing to determine an eye-width margin of the receiver.

Thus, in the blender mode, the first blended clock signal output by the I-path blender/eye-surf mixer 1002 and the second blended clock signal output by the Q-path blender/eye-surf mixer 1004 exhibit a clock skew of 90 degrees. However, in the eye-surf test mode, the first blended clock signal and the second blended clock signal can be generated to exhibit clock skews having values in a range spanning 270°: for example, the clock skew can range from 225° (e.g., Q-path output at 180° minus I-path output at −45°) to −45° (e.g., Q-path output at 45° minus I-path output at) 90°. It will be appreciated that the default blender mode I-Q clock skew of 90 degrees is at the midpoint between 225° and −45°, corresponding to mid-phase code value 24 of the eye-surf code.

In some examples, the eye-surf code encoding scheme and/or the configurations of the I-path blender/eye-surf mixer 1002 and Q-path blender/eye-surf mixer 1004 can be modified, such that the clock skew between the output signals of the unified circuit can extend over a clock skew range with a span of more or less than 270 degrees, such as a value between 225 and 315 degrees.

FIG. 11 is a flow diagram illustrating operations for testing eye-width margin using unified blender and eye-surf functionality. Whereas the method 1100 is described with reference to the various circuits described herein, it will be appreciated that some examples may implement method 1100 using different configurations of circuits and sub-circuits.

Although the example method 1100 depicts a particular sequence of operations, the sequence may be altered without departing from the scope of the present disclosure. For example, some of the operations depicted may be performed in parallel or in a different sequence that does not materially affect the function of the method 1100. In other examples, different components of an example device or system that implements the method 1100 may perform functions at substantially the same time or in a specific sequence.

The method 1100 begins by operating in a blender mode at operation 1102.

At operation 1104, the sampling clock is locked to the input data. The system checks the data signal, sampled by the locked sampling clock, to confirm that there are zero bit errors. Once the lock of the sampling clock to the data signal is established and confirmed, the method 1100 proceeds to operation 1106.

The system then enters an eye-surf test mode at operation 1106 to test eye-width margins of a receiver (e.g., a SerDes receiver including receiver path 800) by sweeping the IQ skew in either direction using the unified circuit. The eye-surf test mode configures a unified blender and eye-surf circuit (e.g., I-path blender/eye-surf mixer 1002 and Q-path blender/eye-surf mixer 1004) to operate in a test configuration rather than normal blending operation.

At operation 1108, a first signal path (e.g., I-path blender/eye-surf mixer 1002) creates a phase offset to generates a first blended clock signal (e.g., a first component of phase-shifted clock signals 818) by combining two phase-shifted clock signals (e.g., two adjacent signals of the first plurality of phase-shifted clock signals provided by the −45° differential pair 1010, 0° differential pair 1012, 45° differential pair 1014, and 90° differential pair 1016) with variable weights. Thus, in some examples, as described above, the first signal path receives phase-shifted clock signals at −45°, 0°, 45°, and 90° and combines them using control codes <15:0>, <31:16>, <47:32>, and <63:48>, respectively, of the eye-surf code.

At operation 1110, a second signal path (e.g., Q-path blender/eye-surf mixer 1004) creates a phase offset to generates a second blended clock signal (e.g., a second component of phase-shifted clock signals 818) by combining two phase-shifted clock signals (e.g., two adjacent signals of the second plurality of phase-shifted clock signals provided by the 45° differential pair 1014, 90° differential pair 1016, 135° differential pair 1028, and 180° differential pair 1030) with variable weights. Thus, in some examples, as described above, the second signal path receives phase-shifted clock signals at 45°, 90°, 135°, and 180° and combines them using an inverted version of the eye-surf code, namely control codes <63:48>, <47:32>, <31:16>, and <15:0>, respectively.

In some examples, operation 1108 and operation 1110 involve applying an IQ skew phase step in a first direction (e.g., the positive direction), then using an edge-based CDR to re-position the Q clock to the data edge while maintaining a locked condition. At operation 1112, the data signal, sampled by the adjusted clock signal, is checked for bit errors. The method 1100 then loops back to operation 1108, such that operations 1108 through 1112 are repeated for all phase steps. IQ skew is then swept in the opposite direction (e.g., the negative direction) and operations 1108 through 1112 are repeated for all phase steps. The positive or negative directions can be defined relative to the default phase separation of 90 degrees between I and Q sampling clock phases.

After operation 1112, the method 1100 changes the weights of the first signal path and second signal path when returning to operation 1108. In some examples, the weights are changed by incrementing, decrementing, or otherwise modifying the eye-surf code, such that the I-path blender/eye-surf mixer 1002 uses the eye-surf code to determine weights to apply to two of its adjacent differential pairs providing the phase-shifted clock signals, and the Q-path blender/eye-surf mixer 1004 uses an inverted version of the eye-surf code to determine weights to apply to two of its adjacent differential pairs providing the phase-shifted clock signals.

In some examples, the method 1100 repeats operation 1108 through operation 1112 until the IQ skew spans a range of 270 degrees, by incrementally adjusting the eye-surf codes from 0 to 48, or otherwise spanning the eye-surf code values 0 through 48 (such as traversing eye-surf codes from 48 to 0, or from 24 to 48 followed by 0 to 24, or in any other order). Some such examples can provide a resolution of 3.9 ps for a 4 GHz clock while reducing circuit area compared to conventional parallel path implementations.

At operation 1114, an eye-width margin of the receiver at the ADC inputs is determined. After the IQ skew has been repeatedly updated to sweep across the full range, with bit errors checked for each update, the eye-width margin can be calculated based on a mapping of eye-surf codes to bit error measurements.

FIG. 12 is a flow diagram illustrating operations for sampling a data signal using unified blender and eye-surf functionality. Whereas the method 1200 is described with reference to the various circuits described herein, it will be appreciated that some examples may implement method 1200 using different configurations of circuits and sub-circuits.

Although the example method 1200 depicts a particular sequence of operations, the sequence may be altered without departing from the scope of the present disclosure. For example, some of the operations depicted may be performed in parallel or in a different sequence that does not materially affect the function of the method 1200. In other examples, different components of an example device or system that implements the method 1200 may perform functions at substantially the same time or in a specific sequence.

The method 1200 begins with operation 1202 that configures the unified blender and eye-surf circuit (e.g., I-path blender/eye-surf mixer 1002 and Q-path blender/eye-surf mixer 1004) to operate in a normal blender mode rather than the eye-surf test mode of FIG. 11. In blender mode, the unified circuit processes clock signals for normal data sampling operations.

At operation 1204, the first signal path (e.g., I-path blender/eye-surf mixer 1002) combines two phase-shifted clock signals (e.g., two adjacent signals of the first plurality of phase-shifted clock signals provided by the −45° differential pair 1010, 0° differential pair 1012, 45° differential pair 1014, and 90° differential pair 1016, such as the adjacent pair of 0° differential pair 1012 and 45° differential pair 1014) in a fixed ratio to generate a first blended clock signal (e.g., a first component of phase-shifted clock signals 818). In some examples, the first signal path receives phase-shifted clock signals at −45°, 0°, 45°, and 90° and blends the 45° and 0° signals to generate an output at 22.5°.

At operation 1206, the second signal path (e.g., Q-path blender/eye-surf mixer 1004) combines two phase-shifted clock signals (e.g., two adjacent signals of the second plurality of phase-shifted clock signals provided by the 45° differential pair 1014, the 90° differential pair 1016, the 135° differential pair 1028, and the 180° differential pair 1030, such as the adjacent pair of 90° differential pair 1016 and 135° differential pair 1028) in a fixed ratio to generate a second blended clock signal (e.g., a second component of phase-shifted clock signals 818). In some examples, the second signal path receives phase-shifted clock signals at 45°, 90°, 135°, and 180° and blends the 90° and 135° signals to generate an output at 112.5°, offset by 90 degrees from the output of the I-path blender/eye-surf mixer 1002. This 90 degree phase offset between the two blended clock signals is maintained during data sampling operation in the blender mode.

At operation 1208, the receiver (e.g., receiver path 800) uses the first and second blended clock signals to sample an incoming data stream. In some examples, the sampling occurs in an edge-based CDR receiver operating in low-datarate mode. The 90-degree phase offset between the first and second blended clock signals enables proper data sampling, with one signal aligned to the data center and one aligned to the data edge.

The method 1200 enables normal data sampling operation using the unified blender and eye-surf circuit, which reduces circuit area compared to implementations requiring separate blending and eye-surf paths. In some examples, the blending operations utilize CML (Current Mode Logic) differential pairs that provide improved linearity compared to voltage mode implementations.

Because the eye-surf test mode of method 1100 is a destructive testing approach that precludes the constant, fixed blending of clock phases used in normal receiver operation during the blending mode of method 1200, only one of method 1100 and method 1200 can be performed at a time. However, the two methods can be performed in sequence or in alternation to test the receiver margin and to operate the receiver to receive and decode data.

In some examples, the Q-path blender/eye-surf mixer 1004 shown in FIG. 10B can be modified to enable the creation of a delay in the clock path that can span +/−135 degrees.

Figure 13:
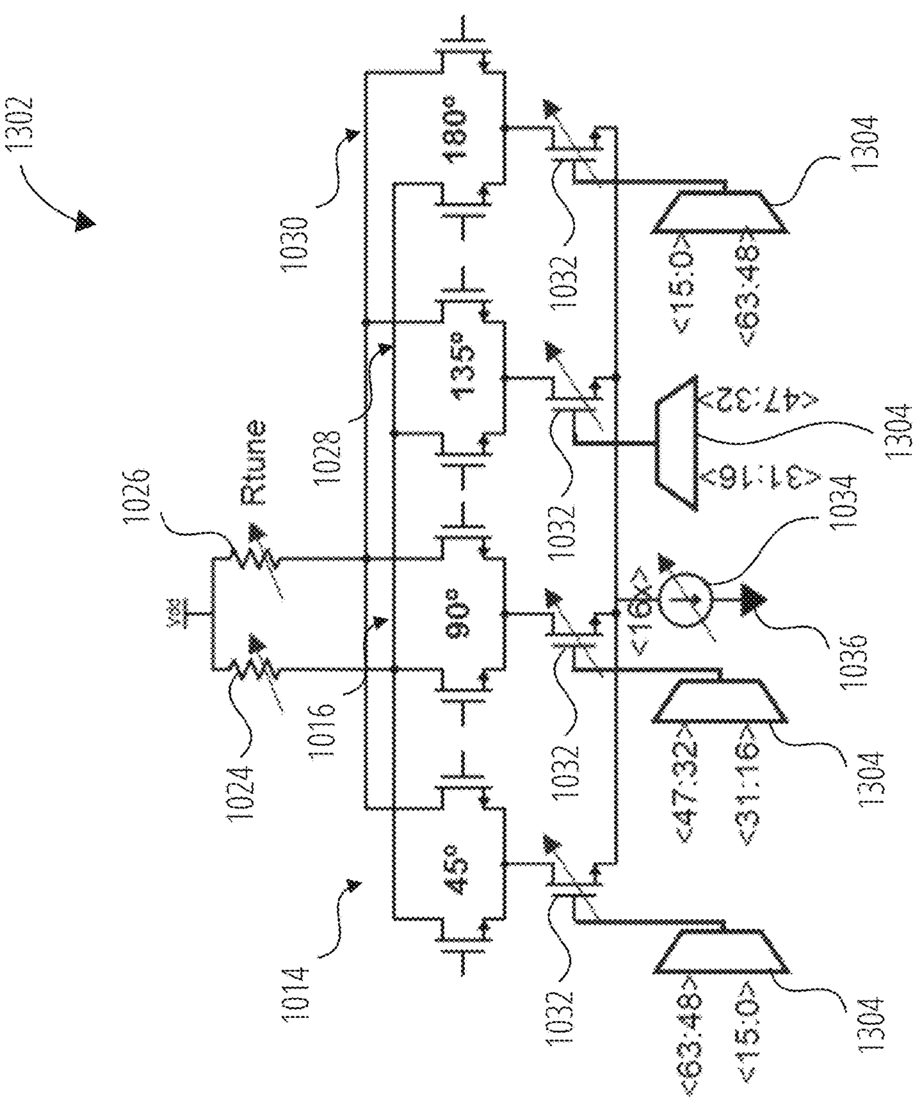
FIG. 13 is a circuit diagram illustrating a multiplexed Q-path blender/eye-surf mixer, according to some examples.

FIG. 13 is a circuit diagram illustrating a multiplexed Q-path blender/eye-surf mixer 1302 for enabling the creation of a delay in the clock path that can span +/−135 degrees. The multiplexed Q-path blender/eye-surf mixer 1302 adds four multiplexers 1304 to select between two alternative subsets of bits of the eye-surf code for weighting each of the four input clocks received by the four differential pairs 1014, 1016, 1028, and 1030.

When a first multiplexer control signal is provided to the multiplexers 1304 (e.g., a MUX signal value of 0), the phases of the I and Q paths are moved in opposite directions, as described above: in this mode, the inputs to each of the switches 1032 are as in FIG. 10B (e.g., the switch 1032 for the 180° differential pair 1030 receives <15:0>, the switch 1032 for the 135° differential pair 1028 receives <31:16>, the switch 1032 for the 90° differential pair 1016 receives <47:32>, and the switch 1032 for the 45° differential pair 1014 receives <63:48>.

However, when a second multiplexer control signal is provided to the multiplexers 1304 (e.g., a MUX signal value of 1), the phases of the I and Q paths are moved in the same direction, in order to enable the creation of a delay in the clock path that can span +/−135 degrees. In this mode, the inputs to each of the switches 1032 are swapped left-to-right relative to those shown in FIG. 10B: in the illustrated example, these swapped subsets of bits are <63:48> for the 180° differential pair 1030, <47:32> for the 135° differential pair 1028, <31:16> for the 90° differential pair 1016, and <15:0> for the 45° differential pair 1014.

This additional feature added to the multiplexed Q-path blender/eye-surf mixer 1302 can be used to introduce a frequency offset or delay in the clock path that can span +/−135 degrees without the need for additional components in the signal path.

An example machine architecture will now be described, providing examples suitable for implementing control logic for performing one or more of the operations of the method 1100 described above as instructions executed by one or more processors of a system, such as the machine described with reference to FIG. 14. In some examples, one or more of the signals described above can be generated by firmware or other software instructions executed by a machine, as described below.

FIG. 14 is a diagrammatic representation of the machine 1400 within which instructions 1402 (e.g., software, a program, an application, an applet, an app, or other executable code) for causing the machine 1400 to perform any one or more of the methodologies discussed herein may be executed. For example, the instructions 1402 may cause the machine 1400 to execute any one or more operations of the methods described herein, and/or to implement one or more components or functions of the systems described herein. The instructions 1402 transform the general, non-programmed machine 1400 into a particular machine 1400 programmed to carry out the described and illustrated functions in the manner described. The machine 1400 may operate as a standalone device or may be coupled (e.g., networked) to other machines. In a networked deployment, the machine 1400 may operate in the capacity of a server machine or a client machine in a server-client network environment, or as a peer machine in a peer-to-peer (or distributed) network environment. The machine 1400 may comprise, but not be limited to, a server computer, a client computer, a personal computer (PC), a tablet computer, a laptop computer, a netbook, a set-top box (STB), a personal digital assistant (PDA), an entertainment media system, a cellular telephone, a smartphone, a mobile device, a wearable device (e.g., a smartwatch), a smart home device (e.g., a smart appliance), other smart devices, a web appliance, a network router, a network switch, a network bridge, or any machine capable of executing the instructions 1402, sequentially or otherwise, that specify actions to be taken by the machine 1400. Further, while a single machine 1400 is illustrated, the term "machine" shall also be taken to include a collection of machines that individually or jointly execute the instructions 1402 to perform any one or more of the methodologies discussed herein. In some examples, the machine 1400 may comprise both client and server systems, with certain operations of a particular method or algorithm being performed on the server-side and with certain operations of the particular method or algorithm being performed on the client-side.

The machine 1400 may include processors 1404, memory 1406, and input/output I/O components 1408, which may be configured to communicate with each other via a bus 1410. In an example, the processors 1404 (e.g., a Central Processing Unit (CPU), a Reduced Instruction Set Computing (RISC) Processor, a Complex Instruction Set Computing (CISC) Processor, a Graphics Processing Unit (GPU), a Digital Signal Processor (DSP), an Application Specific Integrated Circuit (ASIC), a Radio-Frequency Integrated Circuit (RFIC), another processor, or any suitable combination thereof) may include, for example, a processor 1412 and a processor 1414 that execute the instructions 1402. The term "processor" is intended to include multi-core processors that may comprise two or more independent processors (sometimes referred to as "cores") that may execute instructions contemporaneously. Although FIG. 14 shows multiple processors 1404, the machine 1400 may include a single processor with a single-core, a single processor with multiple cores (e.g., a multi-core processor), multiple processors with a single core, multiple processors with multiples cores, or any combination thereof.

The memory 1406 includes a main memory 1416, a static memory 1418, and a storage unit 1420, both accessible to the processors 1404 via the bus 1410. The main memory 1406, the static memory 1418, and storage unit 1420 store the instructions 1402 embodying any one or more of the methodologies or functions described herein. The instructions 1402 may also reside, completely or partially, within the main memory 1416, within the static memory 1418, within machine-readable medium 1422 within the storage unit 1420, within at least one of the processors 1404 (e.g., within the processor's cache memory), or any suitable combination thereof, during execution thereof by the machine 1400.

The I/O components 1408 may include a wide variety of components to receive input, provide output, produce output, transmit information, exchange information, capture measurements, and so on. The specific I/O components 1408 that are included in a particular machine will depend on the type of machine. For example, portable machines such as mobile phones may include a touch input device or other such input mechanisms, while a headless server machine will likely not include such a touch input device. It will be appreciated that the I/O components 1408 may include many other components that are not shown in FIG. 14. In various examples, the I/O components 1408 may include user output components 1424 and user input components 1426. The user output components 1424 may include visual components (e.g., a display such as a plasma display panel (PDP), a light-emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth. The user input components 1426 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and force of touches or touch gestures, or other tactile input components), audio input components (e.g., a microphone), and the like.

Communication may be implemented using a wide variety of technologies. The I/O components 1408 further include communication components 1428 operable to couple the machine 1400 to a network 1430 or devices 1432 via respective coupling or connections. For example, the communication components 1428 may include a network interface component or another suitable device to interface with the network 1430. In further examples, the communication components 1428 may include wired communication components, wireless communication components, cellular communication components, Near Field Communication (NFC) components, Bluetooth® components (e.g., Bluetooth® Low Energy), Wi-Fi® components, and other communication components to provide communication via other modalities. The devices 1432 may be another machine or any of a wide variety of peripheral devices (e.g., a peripheral device coupled via a USB).

Moreover, the communication components 1428 may detect identifiers or include components operable to detect identifiers. For example, the communication components 1428 may include Radio Frequency Identification (RFID) tag reader components, NFC smart tag detection components, optical reader components (e.g., an optical sensor to detect one-dimensional bar codes such as Universal Product Code (UPC) bar code, multi-dimensional bar codes such as Quick Response (QR) code, Aztec code, Data Matrix, Dataglyph™, MaxiCode, PDF417, Ultra Code, UCC RSS-2D bar code, and other optical codes), or acoustic detection components (e.g., microphones to identify tagged audio signals). In addition, a variety of information may be derived via the communication components 1428, such as location via Internet Protocol (IP) geolocation, location via Wi-Fi® signal triangulation, location via detecting an NFC beacon signal that may indicate a particular location, and so forth.

The various memories (e.g., main memory 1416, static memory 1418, and memory of the processors 1404) and storage unit 1420 may store one or more sets of instructions and data structures (e.g., software) embodying or used by any one or more of the methodologies or functions described herein. These instructions (e.g., the instructions 1402), when executed by processors 1404, cause various operations to implement the disclosed examples.

The instructions 1402 may be transmitted or received over the network 1430, using a transmission medium, via a network interface device (e.g., a network interface component included in the communication components 1428) and using any one of several well-known transfer protocols (e.g., hypertext transfer protocol (HTTP)). Similarly, the instructions 1402 may be transmitted or received using a transmission medium via a coupling (e.g., a peer-to-peer coupling) to the devices 1432.

Although the embodiments of the present disclosure have been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art, upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended; that is, a system, device, article, or process that includes elements in addition to those listed after such a term in a claim is still deemed to fall within the scope of that claim.

In view of the disclosure above, various examples are set forth below. It should be noted that one or more features of an example, taken in isolation or combination, should be considered within the disclosure of this application.

Example 1 is a circuit comprising: a first signal path to receive a first plurality of phase-shifted clock signals, the first signal path: in a blender mode, blending phases of two phase-shifted clock signals of the first plurality of phase-shifted clock signals in a fixed ratio to generate a first blended clock signal; and in an eye-surf test mode, creating variable phase offsets as weighted combinations of sets of two phase-shifted clock signals of the first plurality of phase-shifted clock signals to generate the first blended clock signal; and a second signal path to receive a second plurality of phase-shifted clock signals, the second signal path: in the blender mode, blending phases of two phase-shifted clock signals of the second plurality of phase-shifted clock signals in a fixed ratio to generate a second blended clock signal; and in the eye-surf test mode, creating variable phase offsets as weighted combinations of sets of two phase-shifted clock signals of the second plurality of phase-shifted clock signals to generate the second blended clock signal.

In Example 2, the subject matter of Example 1 includes, wherein: in the eye-surf test mode: the first signal path weights its combinations of the sets of two phase-shifted clock signals based on an eye-surf code; and the second signal path weights its combinations of the sets of two phase-shifted clock signals based on an inverted version of the eye-surf code.

In Example 3, the subject matter of Examples 1-2 includes, wherein: in the blender operating mode, a phase of the second blended clock signal is offset from a phase of the first blended clock signal by 90 degrees.

In Example 4, the subject matter of Example 3 includes, degree offset of the phase of the second blended clock signal from the phase of the first blended clock signal is based on an eye-surf code having a mid-phase code value.

In Example 5, the subject matter of Examples 1-4 includes, wherein: in the eye-surf test mode, the circuit is configured to generate each of a plurality of values of a clock skew between the first blended clock signal and second blended clock signal, the plurality of values spanning a clock skew range of between 225 and 315 degrees.

In Example 6, the subject matter of Example 5 includes, wherein: the clock skew range is 270 degrees.

In Example 7, the subject matter of Examples 1-6 includes, wherein: each phase-shifted clock signal of the first plurality of phase-shifted clock signals is received by the first signal path at a differential pair of transistors; and each phase-shifted clock signal of the second plurality of phase-shifted clock signals is received by the second signal path at a differential pair of transistors.

In Example 8, the subject matter of Examples 1-7 includes, wherein: the first plurality of phase-shifted clock signals comprises a series of four phase-shifted clock signals, each phase-shifted 45 degrees from adjacent phase-shifted clock signals in the series; and the second plurality of phase-shifted clock signals comprises a series of four phase-shifted clock signals, each phase-shifted 45 degrees from adjacent phase-shifted clock signals in the series.

In Example 9, the subject matter of Example 8 includes, wherein: the first plurality of phase-shifted clock signals comprises a −45° signal, 0° signal, 45° signal, and 90° signal; and the second plurality of phase-shifted clock signals comprises the 45° signal, the 90° signal, a 135° signal, and a 180° signal.

In Example 10, the subject matter of Examples 1-9 includes, wherein: the second signal path, in the eye-surf test mode, comprises a plurality of multiplexers to select between two sets of control inputs for generating the weighted combinations of the sets of the two phase-shifted clock signals, such that the first signal path and second signal path can be controlled to cause the first blended clock signal and second blended clock signal to be either both delayed by a delay amount or offset relative to each other by an offset amount.

Example 11 is a receiver circuit, comprising: a phase interpolator for processing a clock signal to generate a first plurality of phase-shifted clock signals and a second plurality of phase-shifted clock signals; and a unified blender and eye-surf circuit comprising: a first signal path to receive the first plurality of phase-shifted clock signals, the first signal path: in a blender mode, blending phases of two phase-shifted clock signals of the first plurality of phase-shifted clock signals in a fixed ratio to generate a first blended clock signal; and in an eye-surf test mode, creating variable phase offsets as weighted combinations of sets of two phase-shifted clock signals of the first plurality of phase-shifted clock signals to generate the first blended clock signal; and a second signal path to receive the second plurality of phase-shifted clock signals, the second signal path: in the blender mode, blending phases of two phase-shifted clock signals of the second plurality of phase-shifted clock signals in a fixed ratio to generate a second blended clock signal; and in the eye-surf test mode, creating variable phase offsets as weighted combinations of sets of two phase-shifted clock signals of the second plurality of phase-shifted clock signals to generate the second blended clock signal.

In Example 12, the subject matter of Example 11 includes, wherein: the first plurality of phase-shifted clock signals comprises a −45° signal, 0° signal, 45° signal, and 90° signal; the second plurality of phase-shifted clock signals comprises the 45° signal, the 90° signal, a 135° signal, and a 180° signal; in the eye-surf test mode: the first signal path weights its combinations of the sets of two phase-shifted clock signals based on an eye-surf code; the second signal path weights its combinations of the sets of two phase-shifted clock signals based on an inverted version of the eye-surf code; and the circuit is configured to generate each of a plurality of values of a clock skew between the first blended clock signal and second blended clock signal, the plurality of values spanning a clock skew range of between 225 and 315 degrees; and in the blender operating mode: a phase of the second blended clock signal is offset from a phase of the first blended clock signal by 90 degrees, based on the eye-surf code having a mid-phase code value.

Example 13 is a method comprising: operating a first signal path of a receiver in a blender mode to blend phases of two phase-shifted clock signals of a first plurality of phase-shifted clock signals in a fixed ratio to generate a first blended clock signal; operating a second signal path of the receiver in the blender mode to blend phases of two phase-shifted clock signals of a second plurality of phase-shifted clock signals in a fixed ratio to generate a second blended clock signal; using the first blended clock signal and the second blended clock signal to sample a data signal of the receiver; operating the first signal path in an eye-surf test mode to create variable phase offsets as weighted combinations of sets of two phase-shifted clock signals of the first plurality of phase-shifted clock signals to generate the first blended clock signal; operating a second signal path in the eye-surf test mode to create variable phase offsets as weighted combinations of sets of two phase-shifted clock signals of the second plurality of phase-shifted clock signals to generate the second blended clock signal; and using the first blended clock signal and the second blended clock signal to determine a eye-width margin of the receiver.

In Example 14, the subject matter of Example 13 includes, wherein: in the eye-surf test mode: the first signal path weights its combinations of the sets of two phase-shifted clock signals based on an eye-surf code; and the second signal path weights its combinations of the sets of two phase-shifted clock signals based on an inverted version of the eye-surf code.

In Example 15, the subject matter of Examples 13-14 includes, wherein: in the blender operating mode, a phase of the second blended clock signal is offset from a phase of the first blended clock signal by 90 degrees.

In Example 16, the subject matter of Example 15 includes, degree offset of the phase of the second blended clock signal from the phase of the first blended clock signal is based on an eye-surf code having a mid-phase code value.

In Example 17, the subject matter of Examples 13-16 includes, wherein: in the eye-surf test mode, the first signal path and second signal path are configured to generate each of a plurality of values of a clock skew between the first blended clock signal and second blended clock signal, the plurality of values spanning a clock skew range of between 225 and 315 degrees.

In Example 18, the subject matter of Example 17 includes, wherein: the clock skew range is 270 degrees.

In Example 19, the subject matter of Examples 13-18 includes, receiving each phase-shifted clock signal of the first plurality of phase-shifted clock signals at a differential pair of transistors of the first signal path; and receiving each phase-shifted clock signal of the second plurality of phase-shifted clock signals at a differential pair of transistors of the second signal path.

In Example 20, the subject matter of Examples 13-19 includes, wherein: the first plurality of phase-shifted clock signals comprises a series of four phase-shifted clock signals, each phase-shifted 45 degrees from adjacent phase-shifted clock signals in the series; and the second plurality of phase-shifted clock signals comprises a series of four phase-shifted clock signals, each phase-shifted 45 degrees from adjacent phase-shifted clock signals in the series.

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20.

Example 23 is a system to implement of any of Examples 1-20.

Example 24 is a method to implement of any of Examples 1-20.

"Component" refers, for example, to a device, physical entity, or logic having boundaries defined by function or subroutine calls, branch points, APIs, or other technologies that provide for the partitioning or modularization of particular processing or control functions. Components may be combined via their interfaces with other components to carry out a machine process. A component may be a packaged functional hardware unit designed for use with other components and a part of a program that usually performs a particular function of related functions. Components may constitute either software components (e.g., code embodied on a machine-readable medium) or hardware components. A "hardware component" is a tangible unit capable of performing certain operations and may be configured or arranged in a certain physical manner. In various examples, one or more computer systems (e.g., a standalone computer system, a client computer system, or a server computer system) or one or more hardware components of a computer system (e.g., a processor or a group of processors) may be configured by software (e.g., an application or application portion) as a hardware component that operates to perform certain operations as described herein. A hardware component may also be implemented mechanically, electronically, or any suitable combination thereof. For example, a hardware component may include dedicated circuitry or logic that is permanently configured to perform certain operations. A hardware component may be a special-purpose processor, such as a field-programmable gate array (FPGA) or an application-specific integrated circuit (ASIC). A hardware component may also include programmable logic or circuitry that is temporarily configured by software to perform certain operations. For example, a hardware component may include software executed by a general-purpose processor or other programmable processors. Once configured by such software, hardware components become specific machines (or specific components of a machine) uniquely tailored to perform the configured functions and are no longer general-purpose processors. It will be appreciated that the decision to implement a hardware component mechanically, in dedicated and permanently configured circuitry, or in temporarily configured circuitry (e.g., configured by software), may be driven by cost and time considerations. Accordingly, the phrase "hardware component" (or "hardware-implemented component") should be understood to encompass a tangible entity, be that an entity that is physically constructed, permanently configured (e.g., hardwired), or temporarily configured (e.g., programmed) to operate in a certain manner or to perform certain operations described herein. Considering examples in which hardware components are temporarily configured (e.g., programmed), each of the hardware components need not be configured or instantiated at any one instance in time. For example, where a hardware component comprises a general-purpose processor configured by software to become a special-purpose processor, the general-purpose processor may be configured as respectively different special-purpose processors (e.g., comprising different hardware components) at different times. Software accordingly configures a particular processor or processors, for example, to constitute a particular hardware component at one instance of time and to constitute a different hardware component at a different instance of time. Hardware components can provide information to, and receive information from, other hardware components. Accordingly, the described hardware components may be regarded as being communicatively coupled. Where multiple hardware components exist contemporaneously, communications may be achieved through signal transmission (e.g., over appropriate circuits and buses) between or among two or more of the hardware components. In examples in which multiple hardware components are configured or instantiated at different times, communications between such hardware components may be achieved, for example, through the storage and retrieval of information in memory structures to which the multiple hardware components have access. For example, one hardware component may perform an operation and store the output of that operation in a memory device to which it is communicatively coupled. A further hardware component may then, at a later time, access the memory device to retrieve and process the stored output. Hardware components may also initiate communications with input or output devices, and can operate on a resource (e.g., a collection of information). The various operations of example methods described herein may be performed, at least partially, by one or more processors that are temporarily configured (e.g., by software) or permanently configured to perform the relevant operations. Whether temporarily or permanently configured, such processors may constitute processor-implemented components that operate to perform one or more operations or functions described herein. As used herein, "processor-implemented component" refers to a hardware component implemented using one or more processors. Similarly, the methods described herein may be at least partially processor-implemented, with a particular processor or processors being an example of hardware. For example, at least some of the operations of a method may be performed by one or more processors or processor-implemented components. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an API). The performance of certain of the operations may be distributed among the processors, not only residing within a single machine, but deployed across a number of machines. In some examples, the processors or processor-implemented components may be located in a single geographic location (e.g., within a home environment, an office environment, or a server farm). In other examples, the processors or processor-implemented components may be distributed across a number of geographic locations.

"Computer-readable storage medium" refers, for example, to both machine-storage media and transmission media. Thus, the terms include both storage devices/media and carrier waves/modulated data signals. The terms "machine-readable medium," "computer-readable medium" and "device-readable medium" mean the same thing and may be used interchangeably in this disclosure.

"Machine storage medium" refers, for example, to a single or multiple storage devices and media (e.g., a centralized or distributed database, and associated caches and servers) that store executable instructions, routines and data. The term shall accordingly be taken to include, but not be limited to, solid-state memories, and optical and magnetic media, including memory internal or external to processors. Specific examples of machine-storage media, computer-storage media and device-storage media include non-volatile memory, including by way of example semiconductor memory devices, e.g., erasable programmable read-only memory (EPROM), electrically erasable programmable read-only memory (EEPROM), FPGA, and flash memory devices; magnetic disks such as internal hard disks and removable disks; magneto-optical disks; and CD-ROM and DVD-ROM disks The terms "machine-storage medium," "device-storage medium," "computer-storage medium" mean the same thing and may be used interchangeably in this disclosure. The terms "machine-storage media," "computer-storage media," and "device-storage media" specifically exclude carrier waves, modulated data signals, and other such media, at least some of which are covered under the term "signal medium."

"Non-transitory computer-readable storage medium" refers, for example, to a tangible medium that is capable of storing, encoding, or carrying the instructions for execution by a machine.

"Signal medium" refers, for example, to any intangible medium that is capable of storing, encoding, or carrying the instructions for execution by a machine and includes digital or analog communications signals or other intangible media to facilitate communication of software or data. The term "signal medium" shall be taken to include any form of a modulated data signal, carrier wave, and so forth. The term "modulated data signal" means a signal that has one or more of its characteristics set or changed in such a matter as to encode information in the signal. The terms "transmission medium" and "signal medium" mean the same thing and may be used interchangeably in this disclosure.

What is claimed is:

1. A circuit comprising:

a first signal path to receive a first plurality of phase-shifted clock signals, the first signal path:

in a blender mode, blending phases of two phase-shifted clock signals of the first plurality of phase-shifted clock signals in a fixed ratio to generate a first blended clock signal; and in an eye-surf test mode, creating variable phase offsets as weighted combinations of sets of two phase-shifted clock signals of the first plurality of phase-shifted clock signals to generate the first blended clock signal; and a second signal path to receive a second plurality of phase-shifted clock signals, the second signal path:

in the blender mode, blending phases of two phase-shifted clock signals of the second plurality of phase-shifted clock signals in a fixed ratio to generate a second blended clock signal; and in the eye-surf test mode, creating variable phase offsets as weighted combinations of sets of two phase-shifted clock signals of the second plurality of phase-shifted clock signals to generate the second blended clock signal.

2. The circuit of claim 1, wherein:

in the eye-surf test mode:

the first signal path weights its combinations of the sets of two phase-shifted clock signals based on an eye-surf code; and the second signal path weights its combinations of the sets of two phase-shifted clock signals based on an inverted version of the eye-surf code.

3. The circuit of claim 1, wherein:

in the blender mode, a phase of the second blended clock signal is offset from a phase of the first blended clock signal by 90 degrees.

4. The circuit of claim 3, in the blender mode, the 90 degree offset of the phase of the second blended clock signal from the phase of the first blended clock signal is based on an eye-surf code having a mid-phase code value.

5. The circuit of claim 1, wherein:

in the eye-surf test mode, the circuit is configured to generate each of a plurality of values of a clock skew between the first blended clock signal and second blended clock signal, the plurality of values spanning a clock skew range of between 225 and 315 degrees.

6. The circuit of claim 5, wherein:

the clock skew range is 270 degrees.

7. The circuit of claim 1, wherein:

each phase-shifted clock signal of the first plurality of phase-shifted clock signals is received by the first signal path at a differential pair of transistors; and each phase-shifted clock signal of the second plurality of phase-shifted clock signals is received by the second signal path at a differential pair of transistors.

8. The circuit of claim 1, wherein:

the first plurality of phase-shifted clock signals comprises a series of four phase-shifted clock signals, each phase-shifted 45 degrees from adjacent phase-shifted clock signals in the series; and the second plurality of phase-shifted clock signals comprises a series of four phase-shifted clock signals, each phase-shifted 45 degrees from adjacent phase-shifted clock signals in the series.

9. The circuit of claim 8, wherein:

the first plurality of phase-shifted clock signals comprises a −45° signal, 0° signal, 45° signal, and 90° signal; and the second plurality of phase-shifted clock signals comprises the 45° signal, the 90° signal, a 135° signal, and a 180° signal.

10. The circuit of claim 1, wherein:

the second signal path, in the eye-surf test mode, comprises a plurality of multiplexers to select between two sets of control inputs for generating the weighted combinations of the sets of the two phase-shifted clock signals, such that the first signal path and second signal path can be controlled to cause the first blended clock signal and second blended clock signal to be either both delayed by a delay amount or offset relative to each other by an offset amount.

11. A receiver circuit, comprising:

a phase interpolator for processing a clock signal to generate a first plurality of phase-shifted clock signals and a second plurality of phase-shifted clock signals; and a unified blender and eye-surf circuit comprising:

a first signal path to receive the first plurality of phase-shifted clock signals, the first signal path:

in a blender mode, blending phases of two phase-shifted clock signals of the first plurality of phase-shifted clock signals in a fixed ratio to generate a first blended clock signal; and in an eye-surf test mode, creating variable phase offsets as weighted combinations of sets of two phase-shifted clock signals of the first plurality of phase-shifted clock signals to generate the first blended clock signal; and a second signal path to receive the second plurality of phase-shifted clock signals, the second signal path:

in the blender mode, blending phases of two phase-shifted clock signals of the second plurality of phase-shifted clock signals in a fixed ratio to generate a second blended clock signal; and in the eye-surf test mode, creating variable phase offsets as weighted combinations of sets of two phase-shifted clock signals of the second plurality of phase-shifted clock signals to generate the second blended clock signal.

12. The receiver circuit of claim 11, wherein:

the first plurality of phase-shifted clock signals comprises a −45° signal, 0° signal, 45° signal, and 90° signal;

the second plurality of phase-shifted clock signals comprises the 45° signal, the 90° signal, a 135° signal, and a 180° signal;

in the eye-surf test mode:

the first signal path weights its combinations of the sets of two phase-shifted clock signals based on an eye-surf code;

the second signal path weights its combinations of the sets of two phase-shifted clock signals based on an inverted version of the eye-surf code; and the circuit is configured to generate each of a plurality of values of a clock skew between the first blended clock signal and second blended clock signal, the plurality of values spanning a clock skew range of between 225 and 315 degrees; and in the blender mode:

a phase of the second blended clock signal is offset from a phase of the first blended clock signal by 90 degrees, based on the eye-surf code having a mid-phase code value.

13. A method comprising:

operating a first signal path of a receiver in a blender mode to blend phases of two phase-shifted clock signals of a first plurality of phase-shifted clock signals in a fixed ratio to generate a first blended clock signal;

operating a second signal path of the receiver in the blender mode to blend phases of two phase-shifted clock signals of a second plurality of phase-shifted clock signals in a fixed ratio to generate a second blended clock signal;

using the first blended clock signal and the second blended clock signal to sample a data signal of the receiver;

operating the first signal path in an eye-surf test mode to create variable phase offsets as weighted combinations of sets of two phase-shifted clock signals of the first plurality of phase-shifted clock signals to generate the first blended clock signal;

operating a second signal path in the eye-surf test mode to create variable phase offsets as weighted combinations of sets of two phase-shifted clock signals of the second plurality of phase-shifted clock signals to generate the second blended clock signal; and using the first blended clock signal and the second blended clock signal to determine an eye-width margin of the receiver.

14. The method of claim 13, wherein:

in the eye-surf test mode:

the first signal path weights its combinations of the sets of two phase-shifted clock signals based on an eye-surf code; and the second signal path weights its combinations of the sets of two phase-shifted clock signals based on an inverted version of the eye-surf code.

15. The method of claim 13, wherein:

in the blender operating mode, a phase of the second blended clock signal is offset from a phase of the first blended clock signal by 90 degrees.

16. The method of claim 15, in the blender operating mode, the 90 degree offset of the phase of the second blended clock signal from the phase of the first blended clock signal is based on an eye-surf code having a mid-phase code value.

17. The method of claim 13, wherein:

in the eye-surf test mode, the first signal path and second signal path are configured to generate each of a plurality of values of a clock skew between the first blended clock signal and second blended clock signal, the plurality of values spanning a clock skew range of between 225 and 315 degrees.

18. The method of claim 17, wherein:

the clock skew range is 270 degrees.

19. The method of claim 13, further comprising:

receiving each phase-shifted clock signal of the first plurality of phase-shifted clock signals at a differential pair of transistors of the first signal path; and receiving each phase-shifted clock signal of the second plurality of phase-shifted clock signals at a differential pair of transistors of the second signal path.

20. The method of claim 13, wherein:

the first plurality of phase-shifted clock signals comprises a series of four phase-shifted clock signals, each phase-shifted 45 degrees from adjacent phase-shifted clock signals in the series; and the second plurality of phase-shifted clock signals comprises a series of four phase-shifted clock signals, each phase-shifted 45 degrees from adjacent phase-shifted clock signals in the series.

* * * * *